(12) United States Patent
Sakamoto et al.

(10) Patent No.: US 9,038,535 B2
(45) Date of Patent: May 26, 2015

(54) PRINTER AND METHOD FOR TRANSFERRING WIRING PATTERNS TO OBJECTS

(71) Applicant: Jun SAKAMOTO, Osaka (JP)

(72) Inventors: Koji Sakamoto, Osaka (JP); Jun Sakamoto, Osaka (JP)

(73) Assignee: Jun SAKAMOTO, Osaka (JP)

( * ) Notice: Subject to any disclaimer, the term of this patent is extended or adjusted under 35 U.S.C. 154(b) by 0 days.

(21) Appl. No.: 13/963,806

(22) Filed: Aug. 9, 2013

(65) Prior Publication Data

US 2013/0319271 A1  Dec. 5, 2013

Related U.S. Application Data

(63) Continuation of application No. PCT/JP2012/053246, filed on Feb. 13, 2012.

(30) Foreign Application Priority Data

Feb. 14, 2011  (JP) .................................. 2011-028691

(51) Int. Cl.
*B41M 1/10*  (2006.01)
*B41F 17/26*  (2006.01)
*B41F 9/01*  (2006.01)
*B41F 7/08*  (2006.01)
(Continued)

(52) U.S. Cl.
CPC ................ *B41F 7/08* (2013.01); *H05K 3/1275* (2013.01); *H01L 31/022425* (2013.01); *H01L 31/022433* (2013.01); *H05K 2201/0338* (2013.01); *Y02E 10/50* (2013.01); *B41F 3/36* (2013.01); *B41F 17/26* (2013.01)

(58) Field of Classification Search
CPC ..................................... B41M 1/10; B41F 9/01
USPC ................... 101/150–154, 491, 492, 36, 38.1
IPC ..................................... B41F 17/14; B41M 1/10
See application file for complete search history.

(56) References Cited

U.S. PATENT DOCUMENTS 3,255,695 A * 6/1966 Johnson et al. ................ 101/211
3,261,289 A * 7/1966 Cash et al. ..................... 101/492
(Continued)

FOREIGN PATENT DOCUMENTS

JP  62-191147 A  8/1987
JP  03-001037 U  1/1991
(Continued)

OTHER PUBLICATIONS

Partial English translation of WO 2011/004758 A1, publication date Jan. 13, 2011.*
(Continued)

*Primary Examiner* — Leslie J Evanisko
(74) *Attorney, Agent, or Firm* — Studebaker & Brackett PC

(57) ABSTRACT

A printer according to the present invention includes a transfer roll and a plurality of the printing rolls. At least one printing roll of the plurality of the printing rolls transfers ink containing a conductive material to the transfer roll. Preferably, the at least one printing roll includes a printing roll configured to transfer ink containing a conductive material to the transfer roll and a printing roll configured to transfer ink containing a conductive material to the transfer roll.

12 Claims, 26 Drawing Sheets

(51) Int. Cl.
  *H01L 31/0224* (2006.01)
  *B41F 3/36* (2006.01)
  *H05K 3/12* (2006.01)

(56) References Cited

U.S. PATENT DOCUMENTS

| | | | | |
|---|---|---|---|---|
| 3,392,667 | A | * | 7/1968 | Cassel et al. ............... 101/170 |
| 4,445,432 | A | * | 5/1984 | Ford et al. .................. 101/152 |
| 2002/0170446 | A1 | * | 11/2002 | Willcocks et al. ............ 101/36 |
| 2002/0178954 | A1 | | 12/2002 | Hayashi et al. |
| 2007/0012207 | A1 | | 1/2007 | Takenouchi et al. |
| 2007/0068404 | A1 | | 3/2007 | Hirahara et al. |
| 2011/0283905 | A1 | * | 11/2011 | Sakata ....................... 101/153 |

FOREIGN PATENT DOCUMENTS

| | | | |
|---|---|---|---|
| JP | 03-058841 A | | 3/1991 |
| JP | 04-074650 A | | 3/1992 |
| JP | 2002086036 A | * | 3/2002 |
| JP | 2002-347214 A | | 12/2002 |
| JP | 2004-319094 A | | 11/2004 |
| JP | 2006-035769 A | | 2/2006 |
| JP | 2007-02-01 A | | 2/2007 |
| JP | 2007-044974 A | | 2/2007 |
| JP | 2008-168578 A | | 7/2008 |
| JP | 2009-509808 A | | 3/2009 |
| JP | 2009-233894 A | | 10/2009 |
| JP | 2010-179591 A | | 8/2010 |
| WO | WO 2011004758 A1 | * | 1/2011 |

OTHER PUBLICATIONS

International Search Report; PCT/JP2012/053246; Apr. 24, 2012.
An Office Action issued by the Korean Patent Office on Sep. 11, 2014, which corresponds to Korean Patent Application No. 10-2013-7024179 and is related to U.S. Appl. No. 13/963,806.

* cited by examiner

PRINTER AND METHOD FOR TRANSFERRING WIRING PATTERNS TO OBJECTS

CROSS REFERENCE TO RELATED APPLICATIONS

The present application is a continuation of International Application No. PCT/JP2012/053246, filed Feb. 13, 2012, which claims priority to Japanese Patent Application No. 2011-028691, filed Feb. 14, 2011. The contents of these applications are incorporated herein by reference in their entirety.

BACKGROUND

The present invention relates to printers, printing apparatuses, and printing methods and more specifically relates to a printer, a printing apparatus, and a printing method for forming a layered structure including a conductive layer.

Conductive members, such as wirings and electrodes are formed often by photolithography. In photolithography, after a conductive film (typically, a metal film) is formed on a substrate by sputtering or deposition, a photoresist layer is formed thereon. Then, the photoresist layer is exposed using a mask in which a desired pattern is formed to remove part of the photoresist layer into a desired pattern. Thereafter, patterning by etching is performed on the conductive film to form a conductive layer having a desired shape. Such photolithography can form a miniature pattern that can exhibit high performance. However, formation of the conductive film must be carried out under a vacuum. Further, it requires numerous steps, such as resist application, exposure, pattern formation, conductive film patterning, cleaning, etc., which may reduce throughput and increase cost.

By contrast, offset printing using conductive ink containing a conductive material, such as metal particles is being examined as a scheme for formation of a conductive member through simple processes (see Japanese Patent Application Laid-Open Publication No. 2008-168578, for example, which is incorporated herein by reference). A printing apparatus in Japanese Patent Application Laid-Open Publication No. 2008-168578 includes a plurality of printing units (printers). Each printing unit performs printing so that conductive layers are overlain on each other on a substrate, thereby forming a layered structure of the conductive layers. With the layered structure, low resistance of electrodes and wirings can be attained.

SUMMARY OF INVENTION

According to the printing apparatus of Japanese Patent Application Laid-Open Publication No. 2008-168578, the thickness of layers that each printer can form is limited. For this reason, in order to form a comparatively thick layered structure, large installation space to lay out a plurality of printers is required. Accordingly, where the space for installing the printing apparatus is comparatively small, a comparatively thick layered structure cannot be formed.

The present invention has its object of providing a printer, a printing apparatus, and a printing method, which can form a layered structure including a conductive layer even in small installation space.

A printer according to the present invention is a printer including a transfer roll; and a plurality of printing rolls. At least one printing roll of the plurality of printing rolls transfers ink containing a conductive material to the transfer roll.

In one embodiment, the at least one printing roll includes: a first the printing roll configured to transfer first ink containing a first conductive material to the transfer roll; and a second printing roll configured to transfer second ink containing a second conductive material to the transfer roll.

In one embodiment, the second printing roll transfers the second ink so that the second ink is at least partially overlain on the first ink.

In one embodiment, the second conductive material is the same as the first conductive material.

In one embodiment, the second conductive material is different from the first conductive material.

In one embodiment, the transfer roll includes a core and a plurality of blankets supported by the core.

In one embodiment, the transfer roll further includes a base provided between the core and the plurality of blankets. The base includes a plurality of base portions.

A printing apparatus according to the present invention includes: a conveyor configured to convey a to-be-printed object; and the above printer.

A printing apparatus according to the present invention includes: a conveyor configured to convey a to-be-printed object; and a plurality of printers each according to any of the above printers.

A printing method according to the present invention includes: transferring a plurality of ink to a transfer roll by a plurality of printing rolls; and printing the plurality of ink on a to-be-printed object by the transfer roll. The transferring includes transferring ink containing a conductive material to the transfer roll by at least one of the plurality of the printing rolls.

According to the present invention, a printer, a printing apparatus, and a printing method can be provided which can form a layered structure including a conductive layer even in comparatively small installation space.

DESCRIPTION OF EMBODIMENTS

With reference to the accompanying drawings, description will be made below about a printer, a printing apparatus, and a printing method according to embodiments of the present invention. It is noted that the present invention is not limited to the following embodiments.

Figure 1:
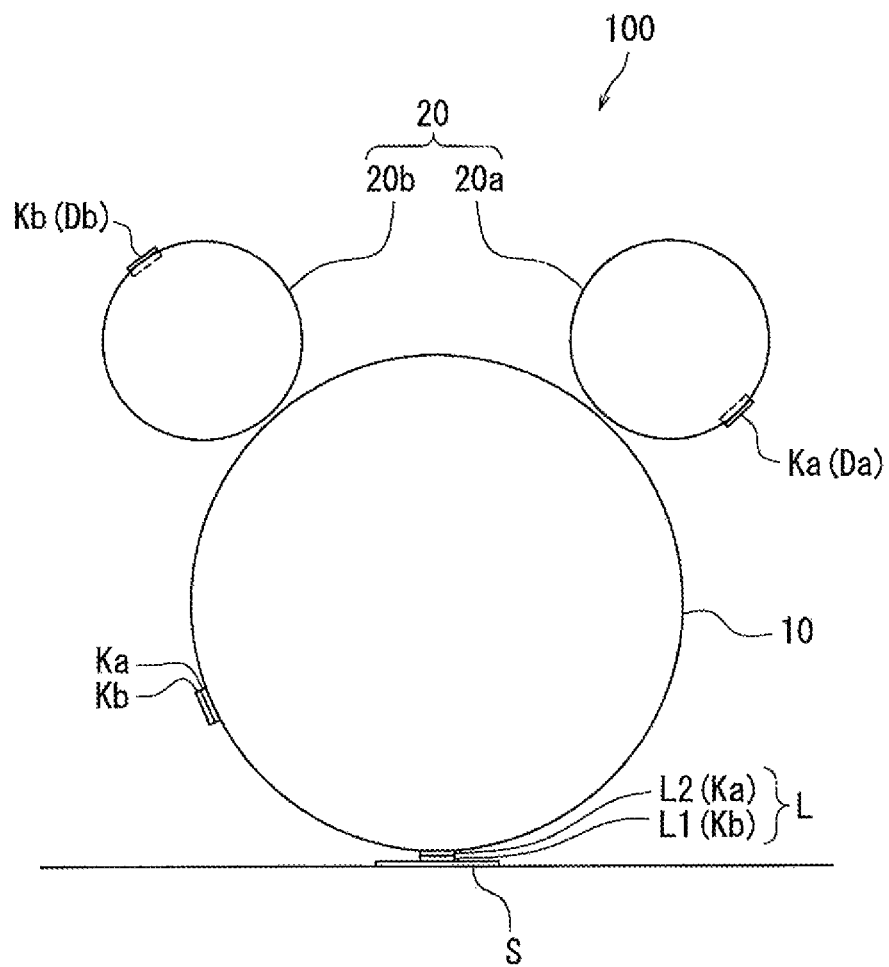
FIG. 1 is a schematic illustration of a printer according to one embodiment of the present invention.

FIG. 1 is a schematic illustration of a printer 100 according to the present embodiment. The printer 100 includes a transfer roll 10 and a plurality of printing rolls 20. Here, two printing rolls 20a, 20b are provided as the printing rolls 20. Each of the transfer roll 10 and the printing rolls 20a, 20b is rotatable. For example, each of the transfer roll 10 and the printing rolls 20a, 20b is columnar or cylindrical in shape. The printing rolls 20a, 20b are provided in the periphery of the transfer roll 10 so as to be substantially circumscribed by the transfer roll 10.

Though not shown herein, a blanket is typically provided on the surface of the transfer roll 10. For example, a blanket made of a rubber based material is wound around the surface of a core.

Each surface of the printing rolls 20a, 20b is subjected to metal plating. Typically, grooves in desired patterns are formed in the printing rolls 20a, 20b. These patterns correspond to lines, figures, patterns, etc. to be printed on a to-be-printed object S. It is noted that the patterns of the printing rolls 20a, 20b may be the same or different from each other.

It is noted that although the diameter of the transfer roll 10 is larger than that of the printing rolls 20a, 20b in FIG. 1, the diameter of the transfer roll 10 may be equal to that of the printing rolls 20a, 20b. It is noted that the diameter of the transfer roll 10 is preferably an integral multiple of the diameter of the printing rolls 20a, 20b. For example, the diameter of the transfer roll 10 may be 200 mm, and the diameter of the printing rolls 20a, 20b may be 100 mm. Further, although the diameter of the printing roll 20a is almost equal to that of the printing roll 20b in FIG. 1, the diameter of the printing roll 20a may be different from that of the printing roll 20b.

The printing roll 20a is configured to transfer ink Ka containing a conductive material Da to the transfer roll 10. The conductive material Da may be a single substance or a mixture of silver, copper, gold, carbon, cobalt, titanium, nickel, aluminum, etc., for example.

The printing roll 20b is configured to transfer ink Kb containing a conductive material Db so that the ink Kb is at least partially overlain on the ink Ka. The conductive material Db may be a single substance or a mixture of silver, copper, gold, carbon, cobalt, titanium, nickel, aluminum, etc., for example. The conductive material Db may be the same as the conductive material Da. Alternatively, the conductive material Db may be different from the conductive material Da. Further, for example, the conductive materials Da, Db may contain different components in part. For example, where one of the conductive materials Da, Db is a mixture, some conductive material in the mixture may be contained in the other conductive material, while another conductive material in the mixture may not be contained in the other conductive material. Furthermore, where both the conductive materials Da, Db are mixtures, some conductive material contained in the conductive material Da may be contained in the conductive material Db, while another conductive material in the conductive material Da may not be contained in the conductive material Db.

For example, both the conductive materials Da, Db may be silver. Alternatively, the conductive material Db may be silver, while the conductive material Da may be copper. It is noted that the conductive material Db is suitably selected according to a material that forms the surface of the to-be-printed object S. For example, where the surface is made of silicon, the use of silver as the conductive material Db can reduce contact resistance. Typically, a metal material having low resistivity is employed as the conductive materials Da, Db.

Thereafter, the layered ink Ka, Kb is transferred from the transfer roll 10 to the to-be-printed object S. For example, the to-be-printed object S may be a substrate. It is noted that the ink Ka, Kb corresponds to the respective patterns formed in the printing rolls 20a, 20b. Such printing may be called offset printing also.

Subsequently, the ink Ka forms a conductive layer L2, while the ink Kb forms a conductive layer L1, thereby forming a layered structure L including the conductive layers L1, L2. Typically, the ink Ka, Kb is heated, thereby forming the conductive layers L2, L1, respectively. For example, the layered structure L may be used as an electrode.

The printing rolls 20a, 20b may be referred to as a first printing roll 20a and a second printing roll 20b, respectively, in the present specification. Also, the conductive materials Da, Db may be referred to as a first conductive material Da and a second conductive material Db, respectively. The ink Ka, Kb may be referred to as first ink Ka and second ink Kb, respectively. Here, the conductive layer L2 has a width substantially equal to that of the conductive layer L1.

The printer 100 of the present embodiment includes the plurality of printing rolls 20a, 20b for the transfer roll 10. This can result in formation of the layered conductive layers L1, L2 even in small installation space for the printer 100. Such the layered structure L can have a comparatively large sectional area even with a small width, thereby attaining low resistance.

Further, where the conductive layer L2 contains the conductive material Da different from the conductive material Db of the conductive layer L1, the conductive material Da can be selected without involving substantial influence on the surface of the substrate S, thereby increasing the degree of freedom for design of the electrode L. For example, the conductive layer L1 containing silver and the conductive layer L2 containing copper may be layered on the substrate S. This can suppress an increase in resistance of the electrode L itself, while reducing the use amount of expensive silver.

With reference to FIG. 2, a printing method according to the present embodiment will be described below.

Figure 2A:
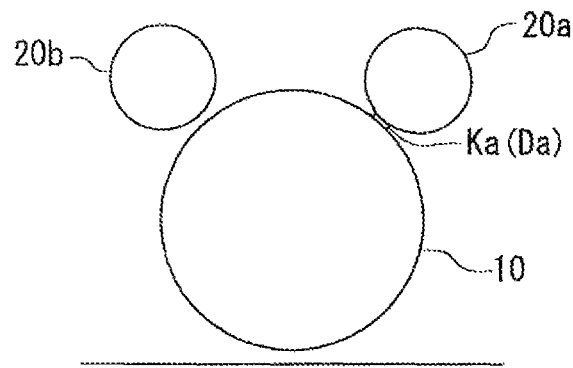
FIGS. 2A-2C are schematic illustrations showing a printing method according to one embodiment of the present invention.

As shown in FIG. 2A, the printing roll 20a transfers the ink Ka containing the conductive material Da to the transfer roll 10. It is noted that the transfer roll 10 and the printing roll 20a rotate at the same speed.

When the ink Ka on the printing roll 20a that is rotating comes into contact with the transfer roll 10, the ink Ka is transferred to the transfer roll 10. For example, the ink Ka contains the conductive material Da in particulate form and a vehicle. The vehicle contains resin and a solvent. The ink Ka has appropriate thixotropy. As described above, the conductive material Da may be a single substance or a mixture of silver, copper, gold, carbon, cobalt, titanium, nickel, aluminum, etc. The resin may be called binder resin also. As the binder resin, generally called inorganic resin, such as acrylic based paste, urethane based paste, etc. may be used, for example. Examples of the solvent may include terpineol, toluene, and xylene. Alternatively, as the solvent, a mixed solvent (e.g., a mixture with polypyrene, glycol, methylene, ether, or acetate) may be employed.

Figure 2B:
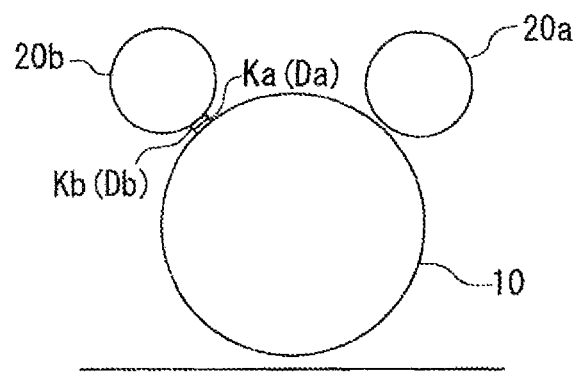

As shown in FIG. 2B, the printing roll 20b transfers the ink Kb containing the conductive material Db so that the ink Kb is at least partially overlain on the ink Ka. Specifically, when the ink Kb on the printing roll 20b that is rotating comes into contact with the transfer roll 10, the ink Kb is transferred to the transfer roll 10. At this time, the ink Kb is transferred so as to be at least partially overlain on the ink Ka. Here, the patterns of the printing rolls 20a, 20b and each rotational speed and each phase of the transfer roll 10 and the printing rolls 20a, 20b are set so that the ink Kb is layered on the ink Ka.

As described above, the conductive material Db may be the same as or different from the conductive material Da. Alternatively, the conductive material Db may be at least in part different from the conductive material Da. Further, for example, the ink Kb includes the conductive material Db in particulate form and a vehicle. The vehicle contains resin and a solvent. The vehicle of the ink Kb may be the same as that of the ink Ka. Or, the vehicle of the ink Kb may be similar to that of the ink Ka.

Figure 2C:
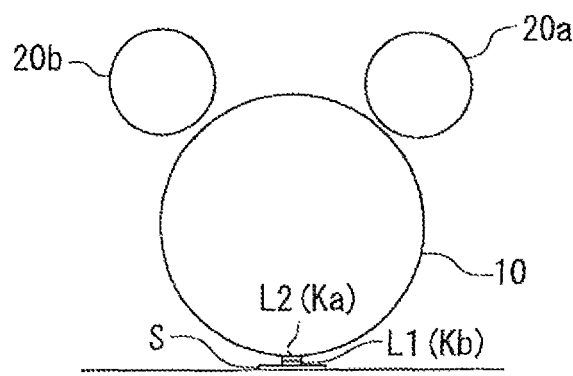

As shown in FIG. 2C, the transfer roll 10 prints the layered ink Ka, Kb on the substrate S. Typically, the ink Ka, Kb is heated subsequently. The heating temperature may be, for example, 500° C. or higher and 850° C. or lower. Baking the ink Ka forms the conductive layer L2 containing the conductive material Da. Baking the ink Kb forms the conductive layer L1 containing the conductive material Db.

Figure 3:
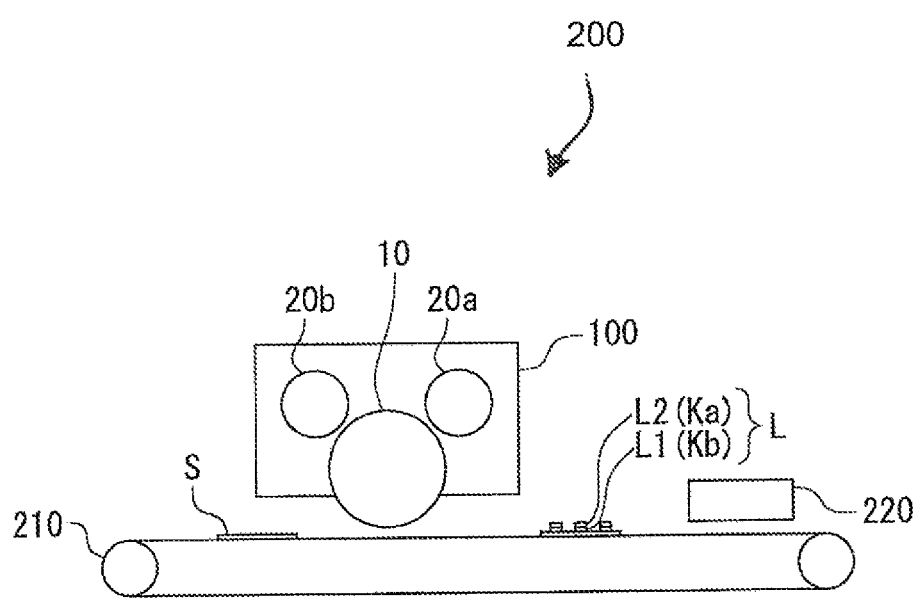
FIG. 3 is a schematic illustration of a printing apparatus according to one embodiment of the present invention.

FIG. 3 is a schematic illustration of a printing apparatus 200 according to the present embodiment. The printing apparatus 200 includes the printer 100 and a conveyor 210 configured to convey the to-be-printed object S. The printing apparatus 200 may further include a heater 220.

First, the to-be-printed object S is placed on the conveyor 210 that is rotating. The conveyor 210 conveys the to-be-printed object S. When the to-be-printed object S conveyed by the conveyor 210 reaches below the printer 100, the printer 100 prints the ink Ka, Kab on the substrate S.

Thereafter, the conveyor 210 conveys the to-be-printed object S, on which the ink Ka, Kb are layered, to the heater 220. The heater 220 heats the to-be-printed object S to bake the ink Ka, Kb. Thus, the ink Ka, Ka is solidified. For this reason, the ink Ka, Ka may be called past Ka, Kb, respectively. Baking forms the conductive layer L2 containing the conductive material Da from the ink Ka, while forming the conductive layer L1 containing the conductive material Db from the ink Kb. Thus, the layered structure L including the layered conductive layers L1, L2 is formed. For example, the to-be-printed object S may be a substrate. The layered structure L may be used as an electrode for a panel including the substrate S.

Figure 4:
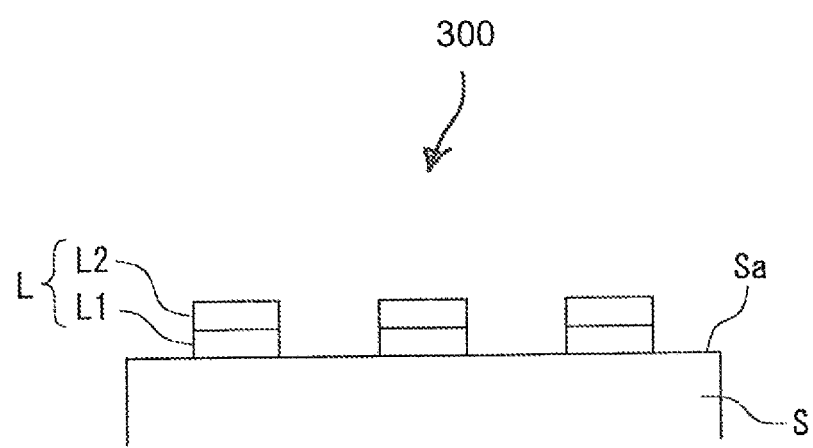
FIG. 4 is a schematic cross sectional view of a panel fabricated by the printer shown in FIG. 1.

With reference to FIG. 4, a panel 300 will be described below. The panel 300 includes the substrate S and the layered structure L provided on an obverse surface Sa of the substrate S. Here, the layered structure L is employed as an electrode having a two-layer structure. The electrode L includes the conductive layer L1 in contact with the obverse surface Sa of the substrate S and the conductive layer L2 provided on the conductive layer L1.

It is noted that although the electrode L is arranged in separate fashion in FIG. 4, respective electrode portions L may be electrically connected together at their other parts to have almost equal potential. Further, the electrode L, which is shown in cross section in FIG. 4, extends in a predetermined direction.

The panel 300 is suitably employed as a solar panel. A solar panel will be described below as one example of the panel 300. However, the panel 300 may be any of touch panels, electro-magnetic field shield panels, organic EL panels, etc.

Although not shown herein, the substrate S includes a photoelectric conversion layer. For example, the substrate S may be a silicon substrate and include a p-type silicon layer and a n-type silicon layer. Specifically, the photoelectric conversion layer may contain amorphous silicon or crystalline silicon. For example, the photoelectric conversion layer may contain single crystalline silicon, polycrystalline silicon, or microcrystalline silicon. Alternatively, the photoelectric conversion layer may contain an inorganic compound material. The photoelectric conversion layer may contain InGaAs, GaAs, a chalcopyrite-based material, $Cu_2ZnSnS_4$, or CdTe—CdS. Or, the photoelectric conversion layer may contain an organic compound. Moreover, in the case where the panel 300 is employed as a solar panel, a plurality of the panels 300 are arranged in group.

Figure 5:
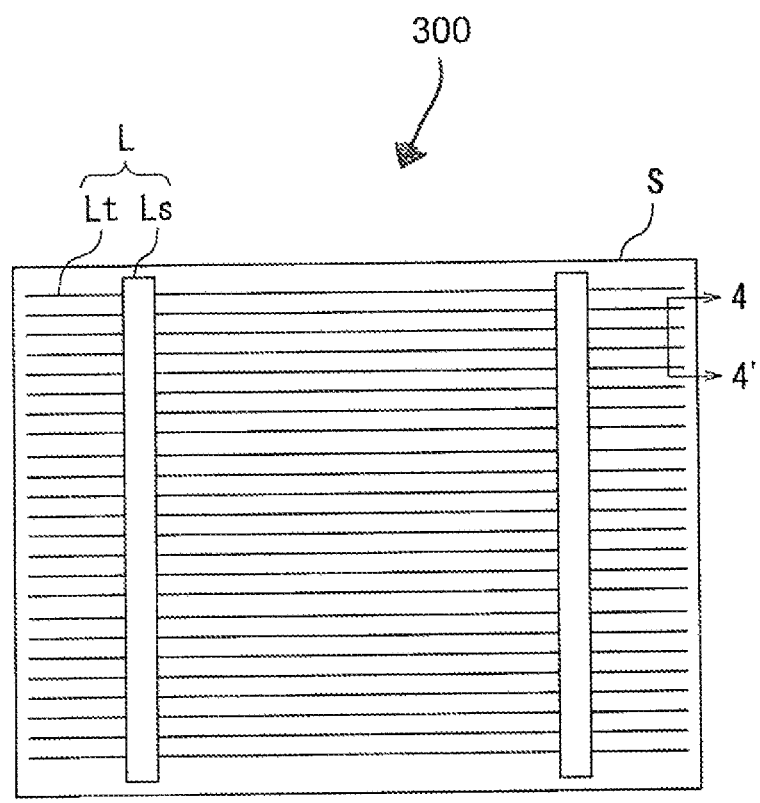
FIG. 5 is a schematic top view of the panel shown in FIG. 4.

FIG. 5 is a schematic top view of the panel 300. The electrode L includes bus bar electrodes Ls and the finger electrodes Lt. The electrode L may be called a collector electrode. The finger electrodes Lt extend from each bus bar electrode Ls. Typically, the finger electrodes Lt are arranged at regular intervals. In general, the bus bar electrodes Ls have a width wider than the finger electrodes Lt. It is noted that FIG. 4 corresponds to a cross section taken along the line 4-4' in FIG. 5.

For example, the panel 300 has a principal surface having a rectangular shape with length and width of 170 mm. Further, for example, the bus bar electrodes Ls have a width of from 2 mm to 3 mm, and the finger electrodes Lt have a width of 15 μm or larger and 70 μm or smaller. The pitch of the finger electrodes Lt (i.e., the distance between the center of one finger electrode Lt and the center of an adjacent finger electrode Lt) is 2 mm. It is noted that the panel 300 may include not only the electrode L provided on the obverse surface Sa of the substrate S but also an electrode (not shown) provided on the reverse surface of the substrate S. This electrode is provided so as to cover the entirety of the reverse surface of the substrate S. For example, this electrode is made of aluminum.

It is noted that in the printer 100 shown in FIG. 1, the printing rolls 20a, 20b may correspond to both the bus bar electrodes Ls and the finger electrodes Lt. The ink corresponding to the electrode L including the bus bar electrodes Ls and the finger electrodes Lt may be transferred to the transfer roll 10. Alternatively, one of the printing rolls 20a, 20b may correspond to one of the bus bar electrodes Ls and the finger electrodes Lt, while the other of the printing rolls 20a, 20b may correspond to the other of the bus bar electrodes Ls and the finger electrodes Lt. For example, the printing roll 20a may correspond to the finger electrodes Lt, while the printing roll 20b may correspond to the bus bar electrodes Ls.

Furthermore, the width of the conductive layer L2 (the ink Ka) is substantially equal to that of the conductive layer L1 (the ink Kb) in FIG. 4, which however, should not be taken to limit the present invention. The width of the conductive layer L2 (the ink Ka) may be different from that of the conductive layer L1 (the ink Kb).

Figure 6:
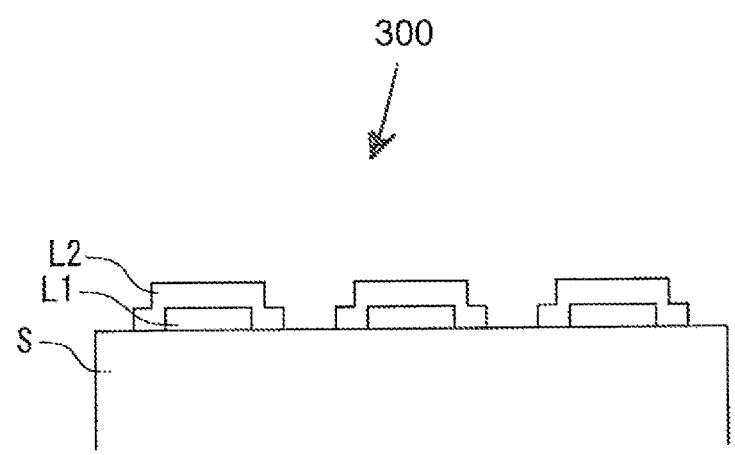
FIG. 6 is a schematic cross sectional view of a panel fabricated by the printer shown in FIG. 1.

For example, as shown in FIG. 6, the width of the conductive layer L2 may be larger than that of the conductive layer L1. In this case, the conductive layer L2 preferably contains a transparent conductive material as the conductive material Da. For example, the transparent conductive material may be indium tin oxide (ITO). Alternatively, the transparent conductive material may be zinc oxide or tin oxide. For example, the transparent conductive material may be a single substance or a mixture of aluminum zinc oxide (AZO), fluorine doped tin oxide (FTO), or antimony tin oxide (ATO). The conductive layer L2 at least partially covers the conductive layer L1, so that the conductive layer L2 can at least partially prevent the conductive layer L1 from being oxidized. Accordingly, the conductive layer L2 can function as an antioxidant layer. In the printer 100 shown in FIG. 1, when the width of the ink Ka (i.e., grooves in the printing roll 20a) is set wider than that of the ink Kb (i.e., grooves in the printing roll 20b), the width of the conductive layer L2 can be wider than that of the conductive layer L1, as shown in FIG. 6.

It is noted that the conductive layer L2 is provided so as to cover the conductive layer L1 in FIG. 6, and the width of the conductive layer L2 is larger than that of the conductive layer L1 in a given cross section including at least the layered structure L, which however, should not be taken to limit the present invention. The width of the conductive layer L2 (the ink Ka) may be smaller than that of the conductive layer L1 (the ink Kb) in the cross section including at least the layered structure L.

Figure 7A:
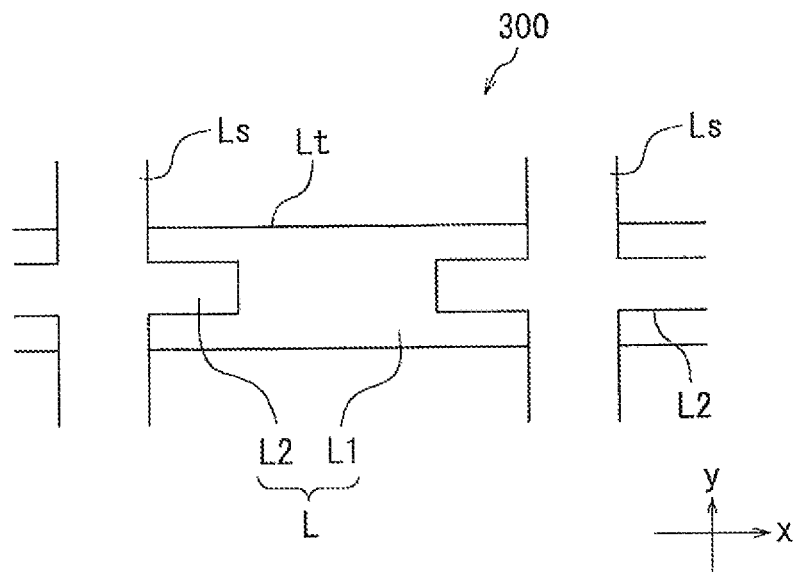
FIGS. 7A and 7B are schematic illustrations of panels fabricated by the printer shown in FIG. 1.

FIG. 7A shows a panel 300 in which the conductive layer L2 has a width smaller than the conductive layer L1 at least in a given region thereof. In comparison of the widths of the conductive layers L1, L2 extending in the x direction (length in the y direction) in this panel 300, the width of the conductive layer L2 is smaller than that of the conductive layer L1. The panel 300 may be a solar panel, for example. In this case, each of the bus bar electrodes Ls and the finger electrodes Lt shown in FIG. 5 includes the conductive layer L1, while the conductive layer L2 are selectively provide in the finger electrodes Lt. Specifically, the conductive layer L2 is provided at a part of each finger electrode Lt in the vicinity of the corresponding bus bar electrode Ls, while not being provided at the central part of each finger electrode Lt. Accordingly, the sectional area of the part of each finger electrode Lt in the vicinity of the corresponding bus bar electrode Ls is larger than that of a part thereof away from each bus bar electrode Ls. Carriers generated in the substrate S are extracted through the electrode L in the vicinity thereof to increase electric current in a part of each finger electrode Lt which is near the corresponding bus bar electrode Ls. In each finger electrode Lt electrically connected to adjacent two bus bar electrodes Ls, the sectional area of a part in the vicinity of the bus bar electrode Ls is larger than that at the central part of the finger electrode Lt. This can achieve reduction in material cost for the finger electrodes Lt with no reduction in current extraction efficiency.

Figure 7B:
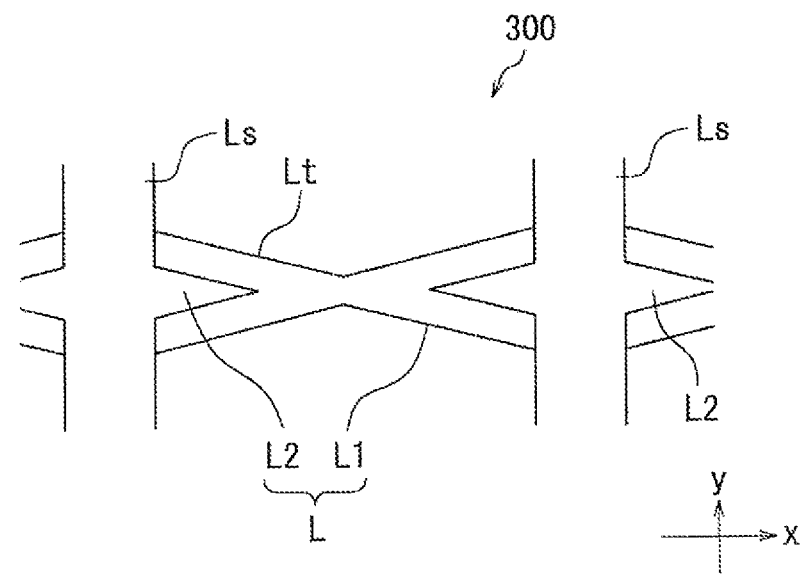

Further, as shown in FIG. 7B, the width of the central part of each finger electrode Lt between adjacent bus bar electrodes Ls (length in the y direction) may be smaller than that of the vicinity of each bus bar electrodes Ls. As such, setting the sectional area of the part of each finger electrode Lt in the vicinity of the corresponding bus bar electrode Ls to be larger than that of the central part thereof can reduce the material cost without involving reduction in current extraction efficiency. Further, the opening area of the solar panel can be increased to efficiently generate the electric current.

It is noted that the printer 100 include the two printing rolls 20a, 20b in the above description, which however, should not be taken to limit the present invention. The printer 100 may include three or more printing rolls.

Figure 8:
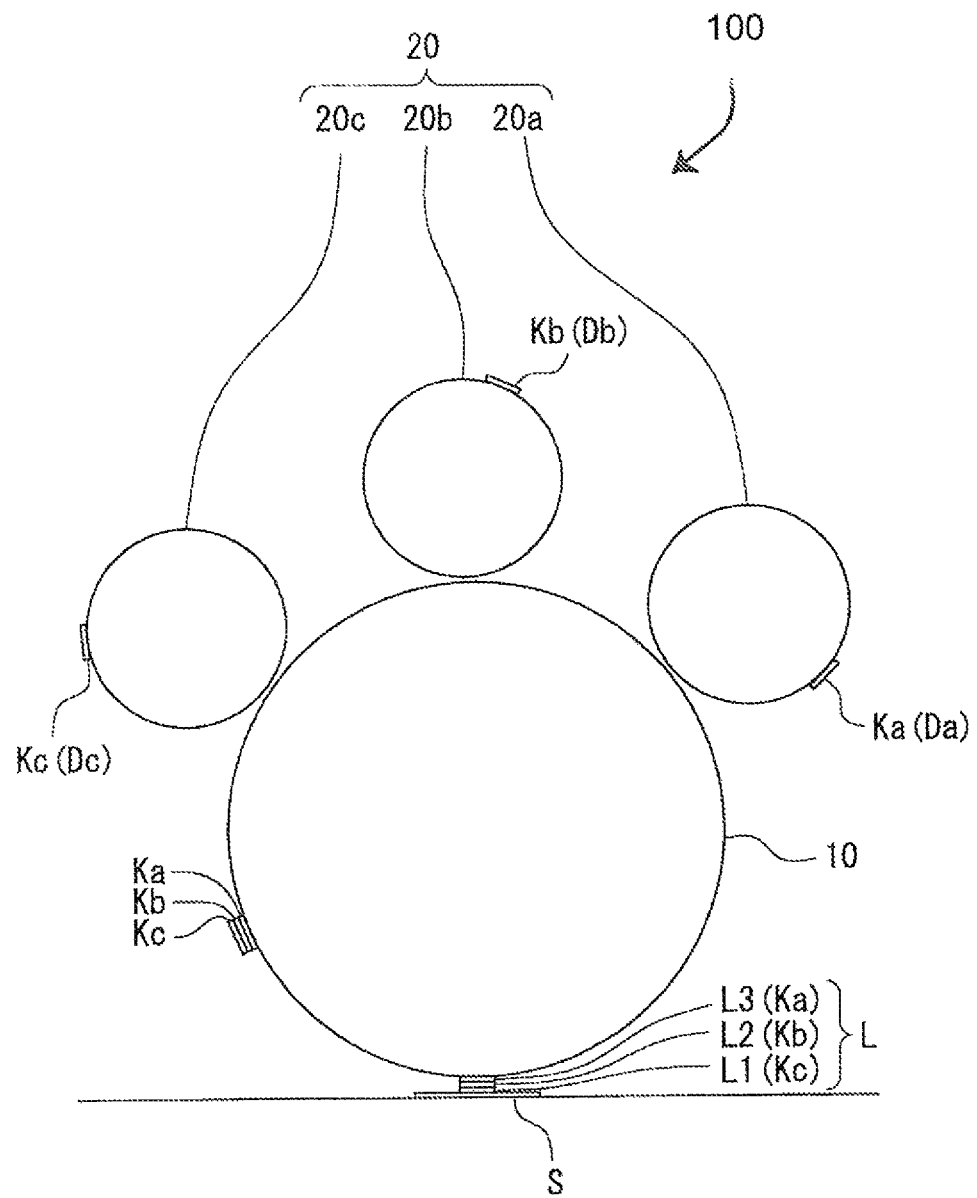
FIG. 8 is schematic illustration of a printer according to one embodiment of the present invention.

FIG. 8 is a schematic illustration of a printer 100 according to the present embodiment. The printer 100 includes the transfer roll 10 and three printing rolls 20a, 20b, 20c. Each of the printing rolls 20a, 20b has a similar configuration to that of the printing rolls 20a, 20b described with reference to FIG. 1. Therefore, duplicate description is omitted for the purpose of avoiding redundancy.

The printing roll 20c transfers ink Kc containing a conductive material Dc so that the ink Kc is at least partially overlain on the ink Kb. It is noted that the ink Kb is transferred so as to be at least partially overlain on the ink Ka, as described above. The conductive material Dc may be a single substance or a mixture of silver, copper, gold, carbon, cobalt, titanium, nickel, aluminum, etc., for example. The conductive material Dc may be the same as the conductive materials Da, Db or different from the conductive materials Da, Db. As such, provision of the three the printing rolls 20a, 20b, 20c in the printer 100 can achieve easy fabrication of a layered structure L including three conductive layers L1, L2, L3.

It is noted that although FIG. 8 shows the printer 100 including the three printing rolls 20a, 20b, 20c, the printer 100 may include four or more printing rolls.

However, too many printing rolls 20 in the printer 100 may pose the following problems. For example, in the case where the printer 100 includes the three printing rolls 20a, 20b, 20c, as shown in FIG. 8, the ink may return to the printing rolls 20 without being appropriately transferred from the printing rolls 20 to the transfer roll 10. The printing roll 20c of the three printing rolls 20a, 20b, 20c, which transfers the ink to the transfer roll 10 last, may not transfer the ink Kc to the transfer roll 10, thereby returning the ink Kc to the printing roll 20c. Further, in the case where the ink Kc of the printing roll 20c is layered on only the ink Kb without being in contact with the ink Ka or the transfer roll 10, the ink Kc may return to the printing roll 20c.

It is considered that returning of the ink Kc as above might be caused because the wettability of the ink Kb to the ink Kc is not so high. This might be because the wettability of the ink Kb is reduced by drying after transfer to the transfer roll 10. Further, since the wettability of the transfer roll 10 is generally lower than that of the substrate S, the transfer roll 10 itself might be ink-repellent in transferring the ink to the substrate S from the transfer roll 10, thereby exhibiting comparatively low wettability. This might be one of the causes also.

It is noted that a simple increase in wettability of the transfer roll 10 can prevent the ink Kc from returning to the printing roll 20c. However, in this case, the ink may be hard to be transferred to the substrate S to remain much on the transfer roll 10 or may be mixed at their boundaries on the transfer roll 10, thereby inviting inappropriate transfer. Accordingly, it is preferable to prevent the ink from returning to the transfer roll 10 without changing the wettability of the transfer roll 10. Such ink returning to the printing rolls 20 is hardly caused typically in the printer 100 including the two printing rolls 20, is caused infrequently in the printer 100 including the three printing rolls 20, and liable to be caused in a printer 100 including four or more printing rolls 20.

Moreover, as described with reference to FIGS. 7A and 7B, in the case where the width of the upper conductive layer (the conductive layer L2 in FIGS. 7A and 7B) is set smaller than that of the lower conductive layer (the conductive layer L1 in FIGS. 7A and 7B) with respect to the substrate S, the shape of the ink is liable to collapse in transfer to the transfer roll 10 in the printers 100 including three printing rolls 20, and especially four or more printing rolls 20.

In view of the foregoing, it is preferable that the number of the printing rolls 20 in the printer 100 is not so large. For example, it is preferable that the number of the printing rolls 20 in the printer 100 is two or three.

Figure 9:
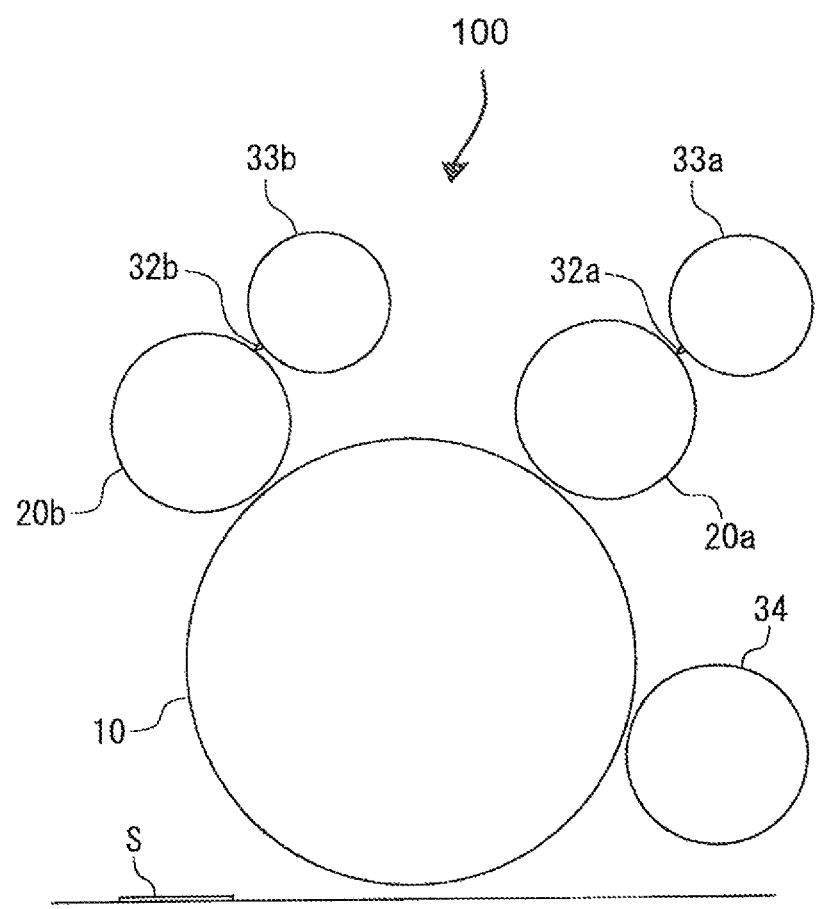
FIG. 9 is a schematic illustration of a printer according to one embodiment of the present invention.

FIG. 9 is a schematic illustration of a printer 100 according to one embodiment of the present invention. The ink in this printer 100 is dripped on the printing rolls 20a, 20b from above. Specifically, the ink Ka is dripped on the printing roll 20a from above, while the ink Kb is dripped on the printing roll 20b from above.

A scraper 32a is provided in the periphery of the printing roll 20a in the printer 100 so as to be in contact with the printing roll 20a. The scraper 32a removes surplus ink of the ink dripped on the outer peripheral surface of the printing roll 20a from the outer peripheral surface of the printing roll 20a. It is noted that the scraper 32a is mounted on an air cylinder. The air cylinder adjusts the pressure of the scraper 32a against the printing roll 20a. The air cylinder is mounted on a holder member 33a. The holder member 33a is rotatable and slidable through a bearing metal. The scraper 32a can slide to move a contact region between the printing roll 20a and the scraper 32a, thereby extending abrasion time. This can reduce generation of a line of the ink. Further, a scraper 32b is provided likewise in the periphery of the printing roll 20b so as to be in contact with the printing roll 20b. An air cylinder to adjust the scraper 32b is mounted on a holder member 33b also.

The printer 100 further includes a cleaning roll 34. The cleaning roll 34 can remove ink remaining on the transfer roll 10 after the transfer roll 10 performs printing on the to-be-printed object S. It is noted that the cleaning roll 34 preferably has wettability to the ink Ka, Kb higher than the transfer roll 10.

It is noted that the ink is supplied by being dripped from above the printing rolls 20a, 20b in the printer 100 shown in FIG. 9. However, ink supply should not be limited to this. The ink may be supplied from an ink reservoir, or be ejected toward the printing roll from a nozzle.

It is noted that the printing apparatus 200 includes the one printer 100 in the description with reference to FIG. 3, which however, should not be taken to limit the present invention. The printing apparatus 200 may include a plurality of printers 100.

Figure 10:
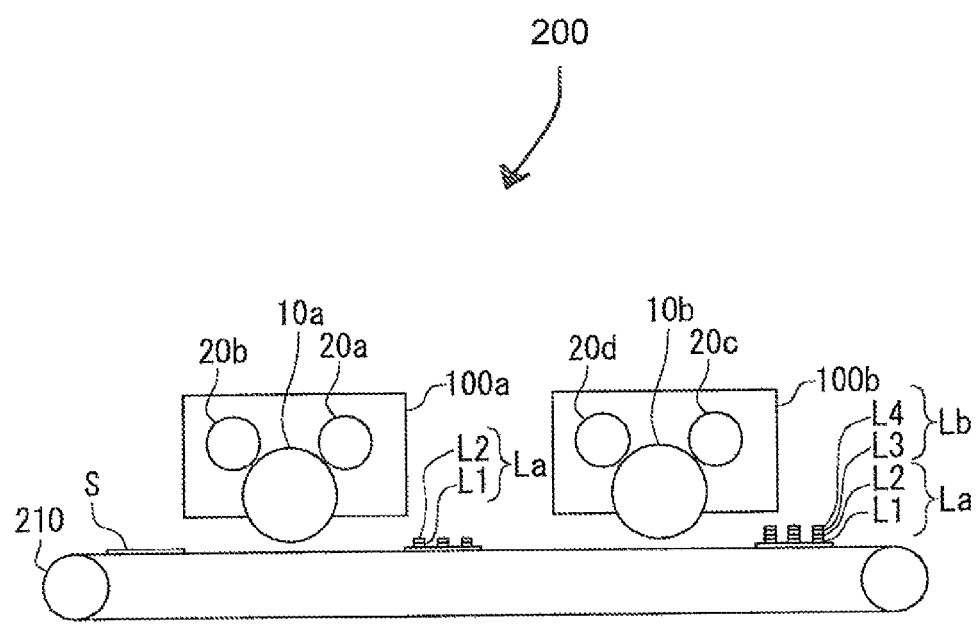
FIG. 10 is a schematic illustration of a printing apparatus according to one embodiment of the present invention.

FIG. 10 is a schematic illustration of a printing apparatus 200 according to the present embodiment. The printing apparatus 200 includes two printers 100a, 100b. The printer 100a is configured to transfer a layered structure La, in which the conductive layers L1, L2 are layered, to the to-be-printed object S. The printer 100b is configured to transfer a layered structure Lb, in which conductive layers L3, L4 are layered, so that the layered structure Lb is at least partially overlain on the layered structure La.

The printer 100a includes a transfer roll 10a and printing rolls 20a, 20b. The printer 100b includes a transfer roll 10b and printing rolls 20c, 20d.

It is noted that the printer 100a has the same configuration as the printer 100 described with reference to FIG. 3. Therefore, duplicate description is omitted for the purpose of avoiding redundancy. Further, the printer 100b has the same configuration as the printer 100a. Therefore, duplicate description is omitted for the purpose of avoiding redundancy. It is noted that patterns of the printing rolls 20c, 20d of the printer 100b are formed so as to accord with a predetermined pattern. It is noted that conductive materials contained in the conductive layers L3, L4 may be the same or different from each other. Further, the conductive materials contained in the conductive layers L3, L4 may be the same as or different from the conductive materials contained in the conductive layers L1, L2.

It is noted that the printing apparatus 200 shown in FIG. 10 includes the two printers 100a, 100b, which however, should not be taken to limit the present invention. The printing apparatus 200 may include three or more printers.

Furthermore, a solar panel is exemplified as the panel 300 in the above description, which however, should not be taken to limit the present invention. The panel 300 may be any of touch panels, organic EL panels, and electro-magnetic wave shield panels.

Still more, the layered structure L is composed of the conductive layers in the above description, which however, should not be taken to limit the present invention. The layered structure may include an insulating layer in addition to a conductive layer. For example, in the printer 100 shown in FIG. 1, the printing roll 20a may transfer ink containing a conductive material, while the printing roll 20b may transfer ink containing an insulating material. In this case, a pattern formed in the printing roll 20a is preferably different from a pattern formed in the printing roll 20b.

Figure 11:
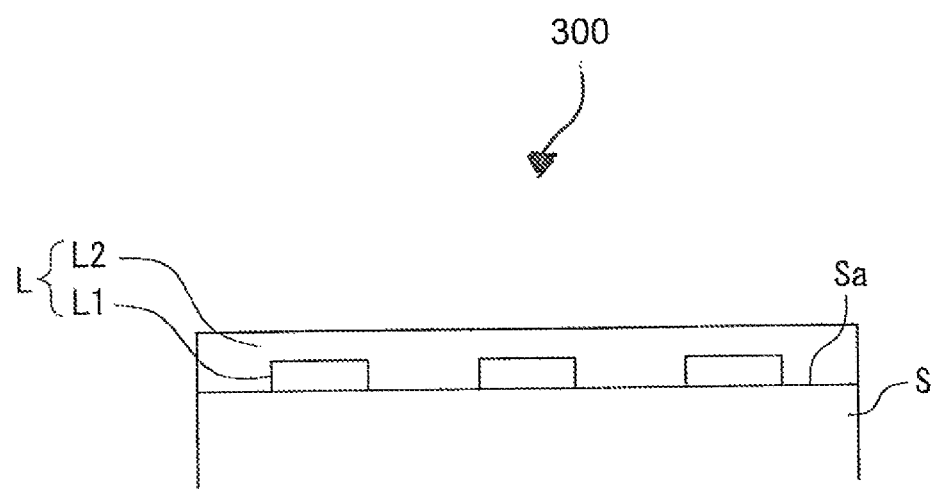
FIG. 11 is a schematic cross sectional view of a panel fabricated by the printer shown in FIG. 1.

FIG. 11 is a schematic illustration of a panel 300. The panel 300 includes the substrate S and a layered structure L provided on the obverse surface Sa of the substrate S. The layered structure L herein includes a conductive layer L1 in contact with the obverse surface Sa of the substrate S and an insulating layer L2 that covers the conductive layer L1.

Such the printer 100 can be suitably employed for fabrication of a semiconductor device. It is noted that transferring ink containing a conductive material by at least one of the printing rolls 20a, 20b in the printer 100 shown in FIG. 1 can result in fabrication of a transistor.

Further, the printer 100 may be employed for fabrication of a multilayer ceramic capacitor. The multilayer ceramic capacitor may be fabricated using, for example, the printer 100 shown in FIG. 8. In this case, the printing roll 20a transfers ink containing a conductive material to the transfer roll 10. The printing roll 20b transfers ink containing an insulating material to the transfer roll 10. The printing roll 20c transfers ink containing a conductive material to the transfer roll 10. Thus, a capacitor can be fabricated. As described above, the printer 100 is suitably used for fabricating electronic equipment.

In general, a blanket for the transfer roll 10 is provided over the entirety of the outer peripheral surface of the transfer roll 10. However, where the diameter of the printing roll 20 is smaller than that of the transfer roll 10, provision of the blanket over the entirety of the outer peripheral surface of the transfer roll 10 may form a non-used portion. This may result in ineffective utilization of the blanket. For this reason, the blanket may be provided in separate fashion on the outer peripheral surface of the transfer roll 10.

Figure 12:
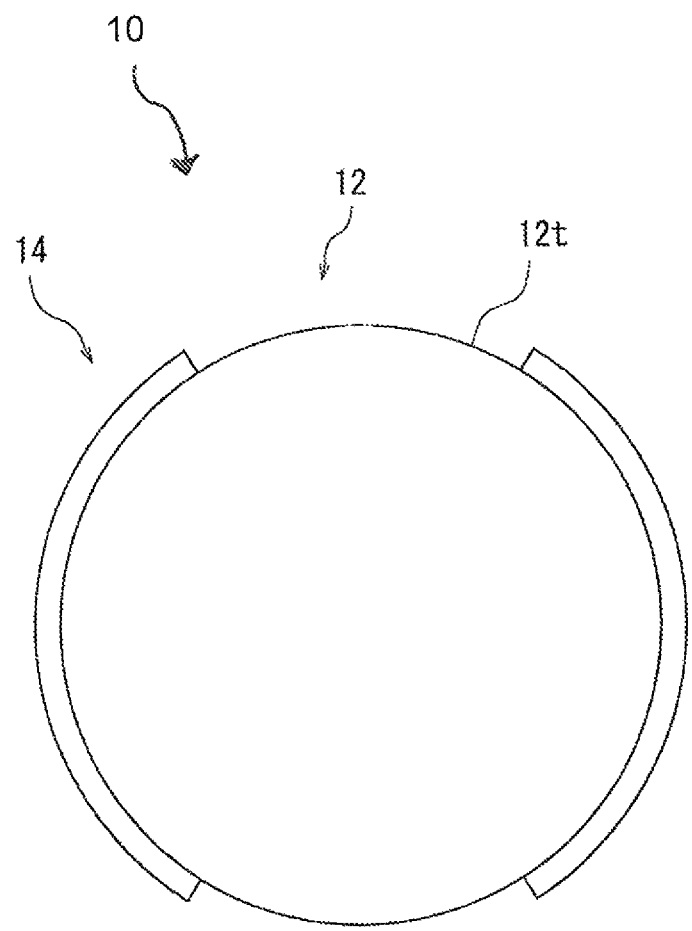
FIG. 12 is a schematic illustration of a transfer roll in a printer according to one embodiment.

FIG. 12 is a schematic illustration of a transfer roll 10. The transfer roll 10 includes a core 12 and a plurality of blankets 14. For example, the core 12 is made of iron, aluminum, or plastic having high strength (e.g., thermosetting resin, such as Bakelite as one example). For example, the core 12 includes cylindrical shafts (not shown) extending from its respective two bottom surfaces (flat surfaces). The transfer roll 10 rotates together with the shafts held at its opposite ends. Alternatively, the core 12 may be cylindrical in shape, and the transfer roll 10, in which a shaft (not shown) is mounted on the inner peripheral surface of the core 12, may rotate together with the shaft.

The blankets 14 are supported by the core 12. Specifically, each blanket 14 is provided so as to cover a part of an outer peripheral surface 12t of the core 12. The blankets 14 are provided separately from each other. The transfer roll 10 rotates about the center of the core 12 as a rotational axis. For example, each blanket 14 has a thickness of 6 mm or larger.

As such, since each blanket 14 is provided on a part of the outer peripheral surface 12t of the core 12, the radius of the transfer roll 10 differs according to the direction from the center of rotation. Specifically, the distance from the rotational axis to the surface of each blanket 14 is longer than the distance from the rotational axis to a part of the outer peripheral surface 12t of the core 12 where the blankets 14 are not provided. A large difference between the distances can achieve appropriate printing on the to-be-printed object S even having a comparatively deep concave surface. Further, printing on the concave surface of the to-be-printed object S is performed with the to-be-printed object S placed on a flattening member having a flat bottom surface, as needed. It is noted that a step may be formed in order to make the difference large between the radius of parts of the transfer roll 10 where the blankets 14 are provided and the radius thereof where the blankets 14 are not provided. The step can further increase the difference in distance from the rotational axis. Accordingly, even when the concave surface of the to-be-printed object S is comparatively deep, the blankets 14 can be prevented from coming into contact with (collision on) a part of the to-be-printed object S which is other than a printing surface, thereby achieving appropriate printing. For example, the to-be-printed object S may be a rear window for an automobile.

Figure 13:
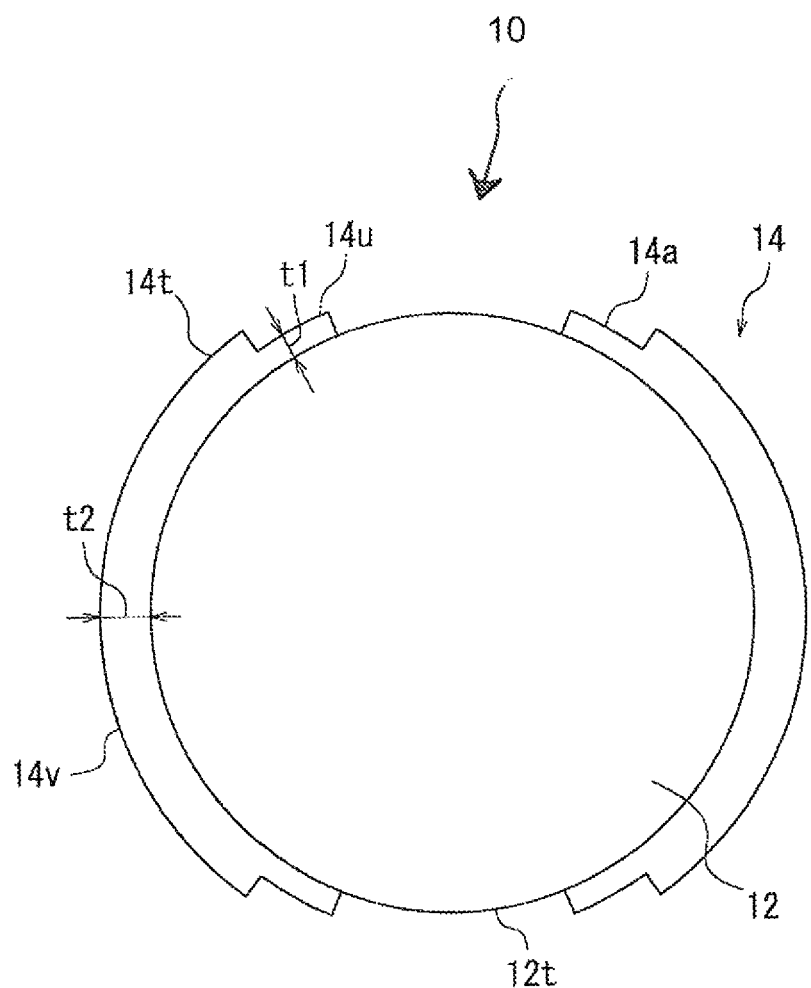
FIG. 13 is a schematic illustration of a transfer roll in a printer according to one embodiment.

FIG. 13 is a schematic illustration of a transfer roll 10. Here, the radius of the core 12 is almost constant, and steps are formed in an outer surface 14t of each blanket 14. Specifically, each blanket 14 includes a region 14u with a thickness t1 and a region 14v with a thickness t2 larger than the thickness t1. Each thickness herein means a distance between the outer peripheral surface 12t of the core 12 and the outer surface 14t of the blanket 14 in a cross section perpendicular to the direction of the rotational axis. Formation of the steps in the blankets 14 in this fashion can achieve appropriate printing on the to-be-printed object S even having a comparatively deep concave surface.

It is noted that the steps are formed in the blankets 14 in the transfer roll 10 shown in FIG. 13, which however, should not be taken to limit the present invention.

Figure 14:
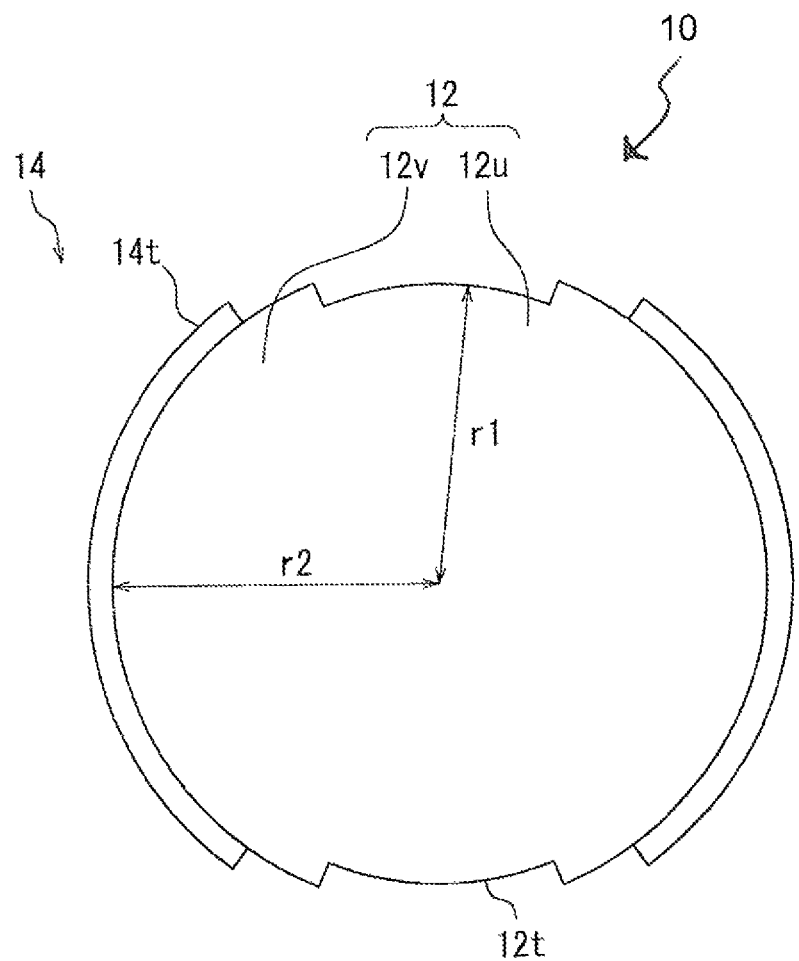
FIG. 14 is a schematic illustration of a transfer roll in a printer according to one embodiment.

FIG. 14 is a schematic illustration of a transfer roll 10. Here, the thickness of the blankets 14 is almost constant, and steps are formed in the outer peripheral surface 12t of the core 12. Specifically, the core 12 includes a region 12u with a radius r1 and a region 12v with a radius r2 larger than the radius r1. Each radius herein means a distance from the center of rotation to the outer peripheral surface 12t of the core 12. The blankets 14 in FIG. 14 are provided in the region 12v with the radius r2 larger than the radius r1. Formation of the steps in the core 12 in this fashion can achieve appropriate printing on the to-be-printed object S even having a comparatively deep concave surface.

It is noted that in each transfer roll 10 shown in FIGS. 13 and 14, the steps are formed in one of the outer peripheral surface 12t of the core 12 and the outer surfaces 14t of the blankets 14, which however, should not be taken to limit the present invention. The steps may be formed in both the outer peripheral surface 12t of the core 12 and the outer surface 14t of the blanket 14.

Moreover, in the case where the blankets 14 are provided directly on the outer peripheral surface 12t of the core 12, as shown in FIGS. 12 to 14, it may be difficult to replace the blankets 14, which have been worn or degraded. In this case, an additional member may be provided between the core 12 and the blankets 14 to facilitate replacement of the blankets 14.

Figure 15:
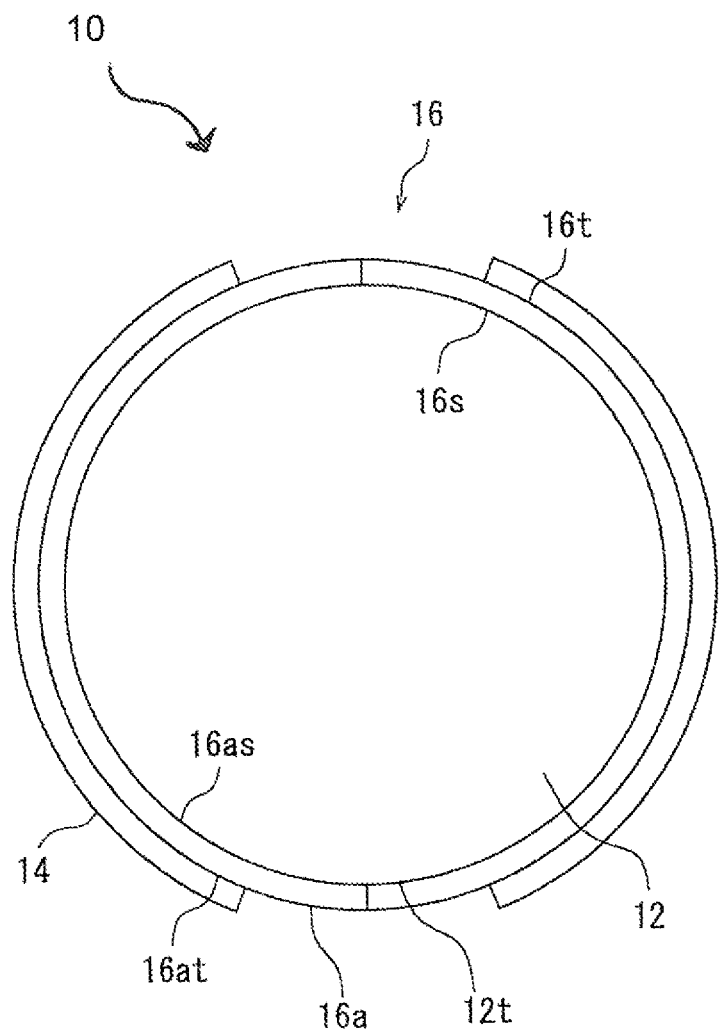
FIG. 15 is a schematic illustration of a transfer roll in a printer according to one embodiment.

FIG. 15 is a schematic illustration of a transfer roll 10 in the printer 100 according to the present embodiment. The transfer roll 10 includes the core 12, the blankets 14, and a base 16. The base 16 may be made of steel or aluminum, for example. The blankets 14 herein are supported by the core 12 through the base 16. Each thickens of the blankets 14 and the base 16 is almost constant in a cross section perpendicular to the rotational axis. The radius of the core 12 is almost constant also.

The base 16 has an inner peripheral surface 16s and an outer peripheral surface 16t. For example, the base 16 is cylindrical in shape. The inner peripheral surface 16s has a shape corresponding to the shape of the outer peripheral surface 12t of the core 12.

The base 16 includes two base portions 16a herein. The base portions 16a, which are adjacent to each other, are in contact with each other, but are separable from each other. Each base portion 16a is in a shape of a half cylinder and has an inner peripheral surface 16as and an outer peripheral surface 16at. For example, the base portions 16a may be formed using a mold.

The two blankets 14 are provided on the outer peripheral surfaces 16at of the respective two base portions 16a herein. Each blanket 14 is provided so as to cover a part of the outer peripheral surface 16at of the corresponding base portion 16a and not to cover the boundary with the adjacent base portion 16a. Further, focusing now on each central angle of the blanket 14 and the base portion 16a (central angle where a section perpendicular to the direction of the rotational axis is seen in the direction parallel to the direction of the rotational axis), the central angle corresponding to the blanket 14 is smaller than that corresponding to the base portion 16a. The blanket 14 and the base portion 16a can be handled integrally.

The blanket 14 can be allowed to adhere to the base portion 16 in the following manner, for example. The blanket 14, which is cut out into a predetermined shape, is attached to the outer peripheral surface 16at of the base portion 16a. In this case, the blanket 14 is preferably made of a material having high adhesiveness to the base portion 16a.

Alternatively, after the base portion 16a is set in a mold, a material for the blanket (e.g., rubber) may be introduced into a predetermined space of the mold for molding to form the blanket 14. In this case, the blanket 14 is formed integrally with the base portion 16a. It is noted that introduction of the material for the blanket is preferably performed under a vacuum. Further, where the blanket 14 is made of silicone rubber, a coupling agent may be coated on the outer peripheral surface 16at of the base portion 16a before molding the blanket 14. Coating the coupling agent on the outer peripheral surface 16at of the base portion 16a can modify the outer peripheral surface 16at of the base portion 16a, thereby increasing the adhesiveness of the blanket 14 to the base portion 16a.

Alternatively, after the blanket 14 and the base portion 16a are formed separately, the blanket 14 may be bonded to the base portion 16a by means of a bonding agent. However, in this case, air or foreign matter intervening in the interface between the blanket 14 and the base portion 16a may form projections and recesses. This may accompany formation of projections and recesses on the surface of the blanket 14. For this reason, it is preferable to allow the blanket 14 to adhere to the base portion 16a by means of a coupling agent, as described above.

Referring to the transfer roll 10 shown in FIG. 15, the blankets 14 are provided on the outer peripheral surfaces 16at of the base portions 16a. Accordingly, each blanket 14 can be easily replaced by taking out the blanket 14 and the corresponding base portion 16a and mounting a new blanket 14 and a new base portion 16a.

Figure 16:
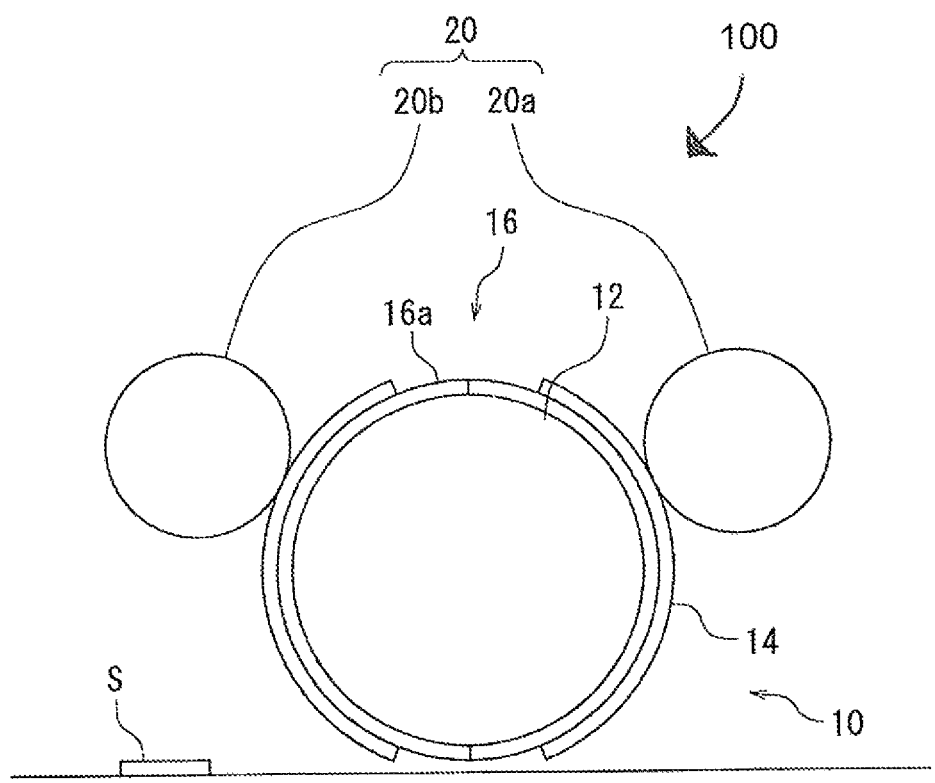
FIG. 16 is schematic illustration of a printer including the transfer roll shown in FIG. 15.

FIG. 16 is a schematic illustration of a printer 100 including the transfer roll 10 shown in FIG. 15. The printer 100 includes the transfer roll 10 and the printing rolls 20a, 20b. Each of the transfer roll 10 and the printing rolls 20a, 20b is rotatable. The printing rolls 20a, 20b are provided in the periphery of the transfer roll 10 so as to be substantially circumscribed with the transfer roll 10. The printing rolls 20a, 20b may have different patterns. Or, the printing rolls 20a, 20b may have substantially the same patterns. In this case, a layered structure can be formed by adjusting each rotational speed and phase of the printing rolls 20a, 20b.

Referring to FIG. 16, the diameter of the transfer roll 10 is larger than that of the printing rolls 20a, 20b. However, the diameter of the transfer roll 10 may be equal to that of the printing rolls 20a, 20b. It is noted that the diameter of the transfer roll 10 is preferably an integer multiple of the diameter of each printing roll 20a, 20b.

The ratio of the diameter of the transfer roll 10 to the diameter of the printing rolls 20a, 20b is equal to the number of the blankets 14 provided at the transfer roll 10. For example, the diameter of the transfer roll 10 may be double the diameter of the printing rolls 20a, 20b, and two blankets 14 may be provided at the transfer roll 10. Here, the diameter of the transfer roll 10 is almost 200 mm, while the diameter of the printing rolls 20a, 20b is almost 100 mm.

The printer 100 performs printing as follows. First, the printing roll 20a transfers ink (not shown) to one of the blankets 14 of the transfer roll 10. Next, the printing roll 20b transfers ink (not shown) to the same blanket 14 of the transfer roll 10. For example, the printing roll 20b transfers the ink so that the ink is at least partially layered on the previously transferred ink. Thereafter, the transfer roll 10 prints the layered ink on the to-be-printed object S. It is noted that the respective ink corresponds to the patterns formed in the printing rolls 20a, 20b. Then, typically, the ink is heated.

Figure 17:
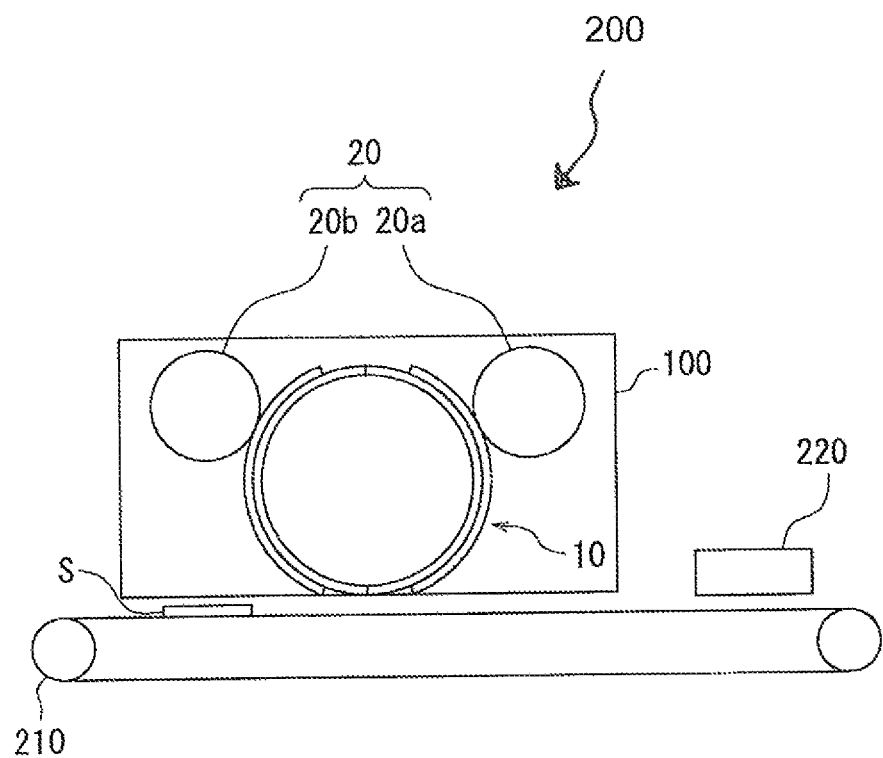
FIG. 17 is a schematic illustration of a printing apparatus including the printer shown in FIG. 16.

FIG. 17 is a schematic illustration of a printing apparatus 200 including the printer 100. First, the to-be-printed object S is placed on the conveyor 210 that is rotating. The conveyor 210 conveys the to-be-printed object S. When the to-be-printed object S conveyed by the conveyor 210 reaches below the printer 100, the printer 100 prints ink on the to-be-printed object S.

Then, the conveyor 210 conveys the to-be-printed object S, on which the ink is layered, to the heater 220. The heater 220 heats the to-be-printed object S to bake the ink. Thus, the ink is solidified.

It is noted that when almost the same patterns are formed in the printing rolls 20a, 20b, and each printing roll 20a, 20b transfers ink containing a conductive material so that the ink is overlain on each other, a comparatively thin conductive layered structure with low resistance can be formed. For example, each printing roll 20a, 20b transfers ink containing a conductive material to the transfer roll 10. The conductive material may be a single substance or a mixture of silver, copper, gold, carbon, cobalt, titanium, nickel, aluminum, etc., for example. It is noted that the conductive materials contained in the ink on the printing rolls 20a, 20b may be the same or different from each other. As such, when the ink transferred from the printing rolls 20a, 20b to the transfer roll 10 is layered, an electrode with low resistance can be formed.

Figure 18:
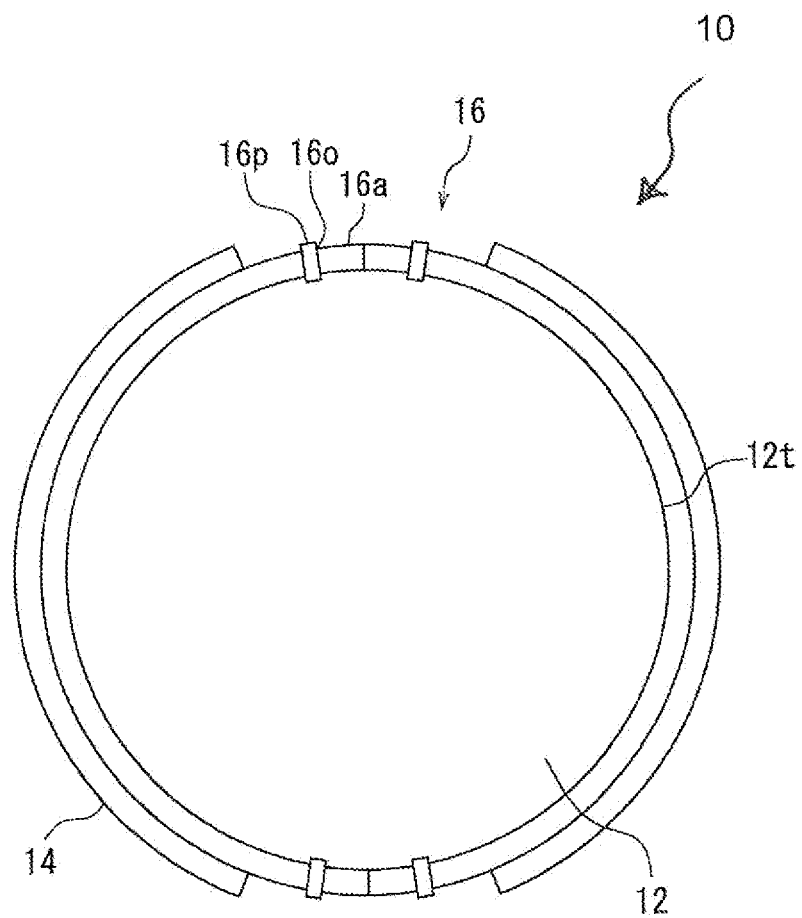
FIG. 18 is a schematic cross sectional view of a transfer roll in a printer according to one embodiment.
Figure 19:
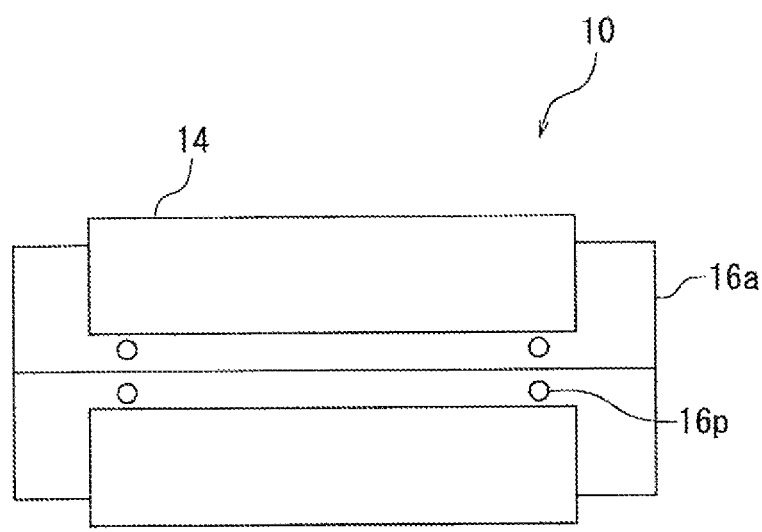
FIG. 19 is a schematic top view of the transfer roll shown in FIG. 18.

The core 12 may be fixed to the base 16 using a fixing member. FIG. 18 schematically shows a cross section of a transfer roll 10. FIG. 19 schematically shows the top surface of the transfer roll 10. In the transfer roll 10, through holes 16o are formed in the base portions 16a. A fixing member 16p is provided in each through hole 16o to fix the base 16 to the core 12. For example, the outer peripheral surface 12t of the core 12 may be screw cut so that the base 16 is fixed by screwing. The fixing member 16p is arranged between the different blankets 14 herein.

It is noted that in the transfer roll 10 shown in FIGS. 15-19, each blanket 14 is disposed at a part of the outer peripheral surface 16at of the corresponding base portion 16a, and the central angle corresponding to the blanket 14 is smaller than the central angle corresponding to the base portion 16a, which however, should not be taken to limit the present invention.

Figure 20A:
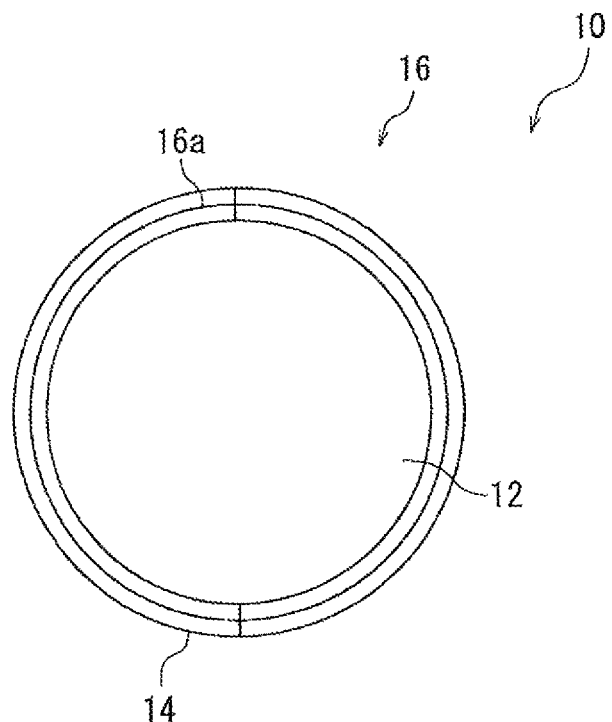
FIG. 20A is a schematic side view of a transfer roll of a printer in one embodiment.
Figure 20B:
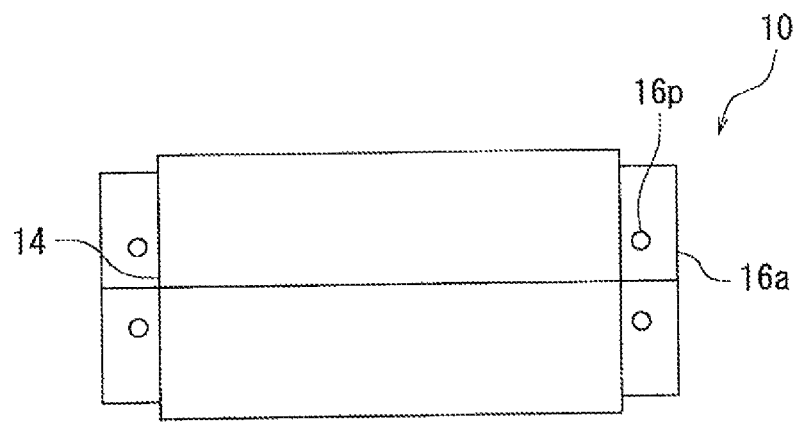
FIG. 20B is a schematic top view of FIG. 20A.

As shown in FIG. 20A, when a section perpendicular to the direction of the rotational axis is seen, the blankets 14 may be provided over the entirety of the outer peripheral surface 16at of the base portions 16a. In this case, the central angle corresponding to each blanket 14 is equal to the central angle corresponding to each base portion 16a. Further, in this case, as shown in FIG. 20B, the fixing member 16p is provided on each opposite end of the blanket 14 in the direction of the rotational axis.

It is noted that in order to prevent displacement in mounting the base 16 to the core 12 and in use of the transfer roll 10, a protrusion may be formed on either the outer peripheral surface 12t of the core 12 or the inner peripheral surface 16s of the base 16, while a recess corresponding to the protrusion may be formed in the other.

Figure 21:
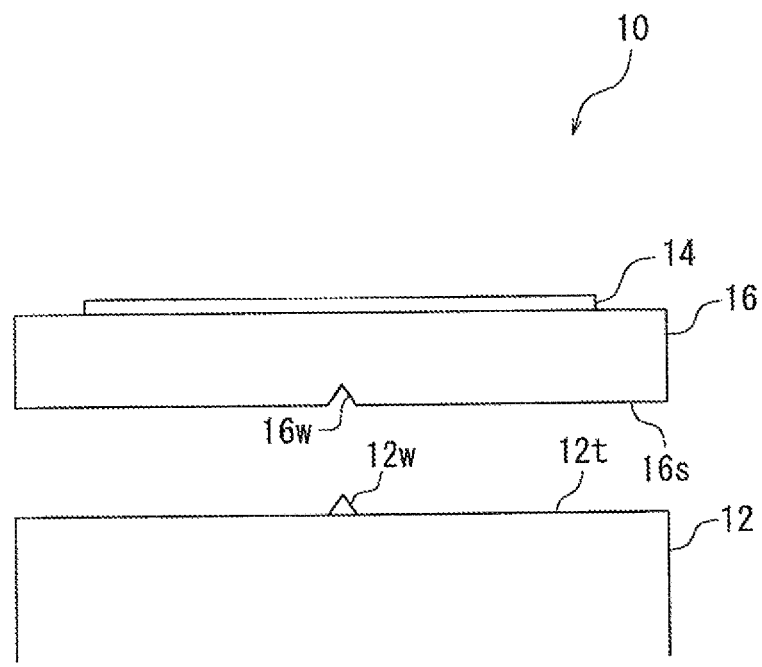
FIG. 21 is a partially exploded view schematically showing a transfer roll in a printer according to one embodiment.

With reference to FIG. 21, one example of a transfer roll 10 will be described below, in which a protrusion and a recess are formed on and in the outer peripheral surface 12t of the core 12 and the inner peripheral surface 16s of the base 16, respectively. FIG. 21 is a partially exploded view showing the vicinity of the boundary between the core 12 and the base 16 of the transfer roll 10. In the transfer roll 10 shown in FIG. 21, the rotational axis is parallel to the surface of the paper.

A protrusion 12w and a recess 16w are formed on and in the outer peripheral surface 12t of the core 12 and the inner peripheral surface 16s of the base 16, respectively, in the transfer roll 10. The protrusion 12w on the outer peripheral surface 12t of the core 12 and the recess 16w in the inner peripheral surface 16s of the base 16 are almost the same in size, and their shapes correspond to each other. This can prevent displacement between the core 12 and the base 16. For example, the protrusion 12w on the outer peripheral surface 12t of the core 12 can be formed in a manner that a columnar or cylindrical member is shaven by a lathe so as to leave a protrusion.

It is noted that the protrusion 12w on the outer peripheral surface 12t of the core 12 and the recess 16w in the inner peripheral surface 16s of the base 16 may be formed in dotted fashion. In this case, a plurality of the protrusions 12w and a plurality of the recesses 16w may be formed on the outer peripheral surface 12t and in the inner peripheral surface 16s, respectively.

Alternatively, the protrusion 12w on the outer peripheral surface 12t of the core 12 and the recess 16w in the inner peripheral surface 16s of the base 16 may be linear. Such a recess in the inner peripheral surface 16s of the base 16 may be called a guide groove also. Formation of the protrusion 12w and the recess 16w in the rotational direction of the transfer roll 10 can prevent displacement of the to-be-printed object in a direction orthogonal to the conveyance direction in printing.

It is noted that the base 16 is composed of the two base portions 16a in the above description, which however, should not be taken to limit the present invention.

Figure 22:
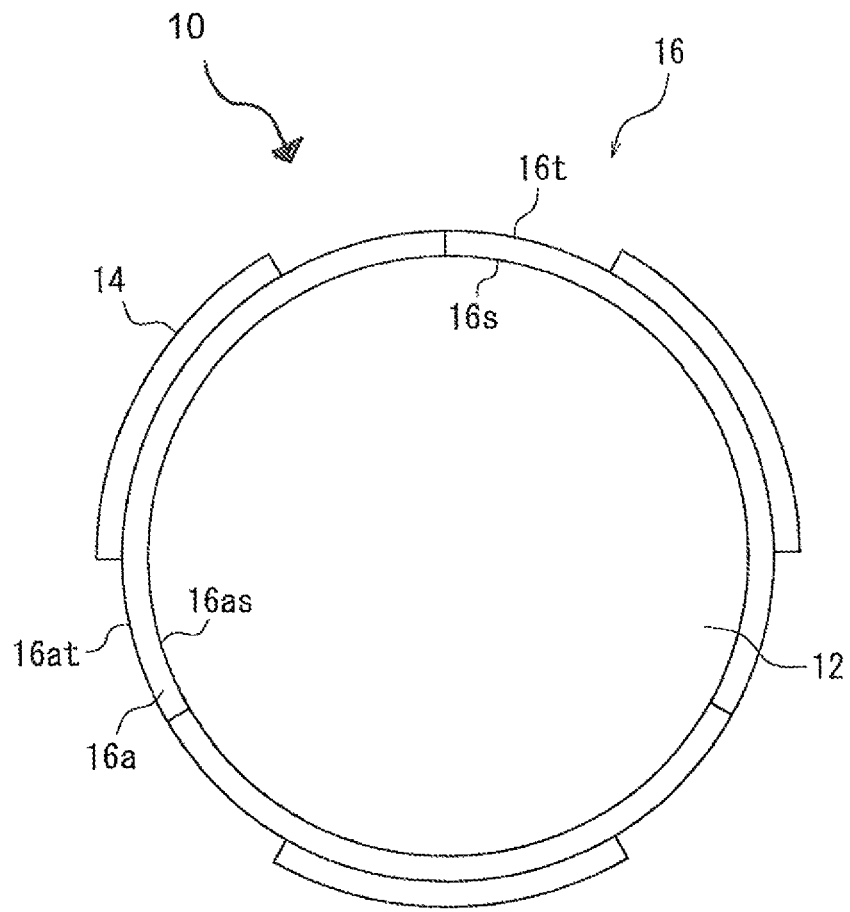
FIG. 22 is a schematic illustration of a transfer roll in a printer according to one embodiment.

As shown in FIG. 22, the base 16 may include three base portions 16a. Here, three blankets 14 are provided on respective outer peripheral surfaces 16at of the three base portions 16a. It is noted that in the case where such the transfer roll 10 is employed in the printer 100 (see FIG. 16), it is preferable that the number of the printing rolls 20 is equal to the number of the blankets 14, and the number of the printing rolls 20 is almost equal to the ratio of the diameter of the transfer roll 10 to the diameter of the printing rolls 20.

Further, the number of the base portions 16a in the transfer roll 10 may be four or more, and the number of the blankets 14 may be four or more. Moreover, although one blanket 14 is provided for each base portion 16a in the above description, a plurality of blankets 14 may be provided for each base portion 16a.

Figure 23:
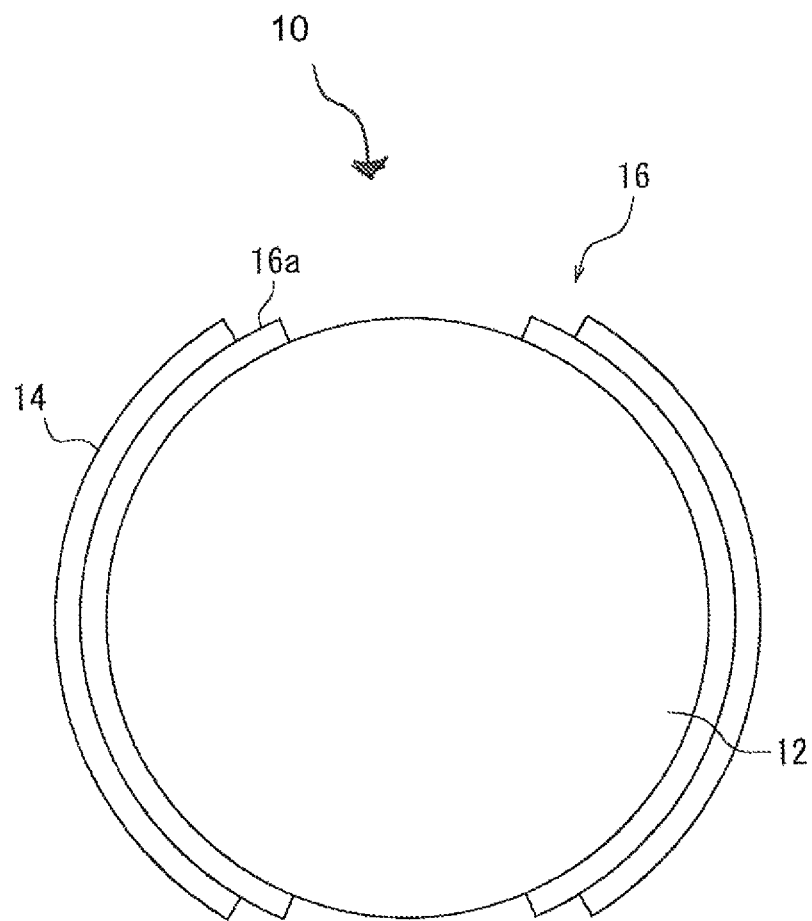
FIG. 23 is a schematic illustration of a transfer roll in a printer according to one embodiment.

It is noted that the base portions 16a adjacent to each other are in contact with each other in the above description, which however, should not be taken to limit the present invention. As shown in FIG. 23, the adjacent base portions 16a may be out of contact with each other.

Furthermore, when a blanket 14 is provided at a part of the outer peripheral surface 16t of the base 16, the radius of the transfer roll 10 differs according to the direction from the center of rotation. Specifically, the distance from the rotational axis to the surface of the blanket 14 is longer than the distance from the rotational axis to a part of the outer peripheral surface 16t of the base 16 where the blanket 14 is not provided. A large difference between the distances can achieve appropriate printing on the to-be-printed object S even having a comparatively deep concave surface.

The radius of the core 12, the thickness of the blankets 14, and the thickness of the base 16 are almost constant in the above description, which however, should not be taken to limit the present invention. A step may be formed in at least one of the outer peripheral surface 12t of the core 12, the surfaces of the blankets 14, and the outer peripheral surface 16t of the base 16. With the step, the difference in distance from the rotational axis can be increased further. Accordingly, even where the concave surface of the to-be-printed object S is comparatively deep, the blankets 14 can be prevented from coming in to contact with (collision on) the to-be-printed object S in an area other than the printing area, thereby achieving appropriate printing.

Figure 24:
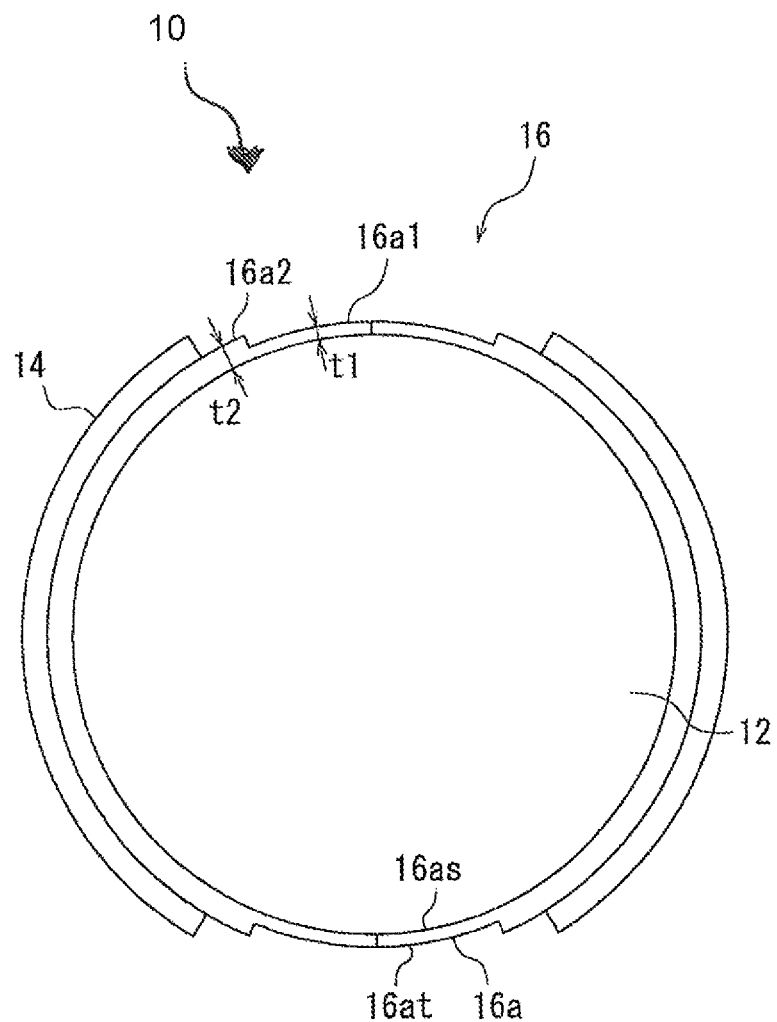
FIG. 24 is a schematic illustration of a transfer roll in a printer according to one embodiment.

FIG. 24 is a schematic illustration of a transfer roll 10. Here, the radius of the core 12 and the thickness of the blankets 14 are almost constant, and steps are formed in the base portions 16a. Specifically, each base portion 16a includes a region 16a1 with a thickness t1 and a region 16a2 with a thickness t2 larger than the thickness t1. Each thickness herein means a distance between the inner peripheral surface 16as and the outer peripheral surface 16at of the base portion 16a in a cross section perpendicular to the direction of the rotational axis. Each blanket 14 is provided in the region 16a2 with the thickness t2 larger than the thickness t1 in FIG. 24. As such, formation of the steps in the base portions 16a can achieve appropriate printing on the to-be-printed object S even having a comparatively deep concave surface.

The steps are formed in the base 16 in the transfer roll 10 shown in FIG. 24, which however, should not be taken to limit the present invention. A step may be formed in the core 12.

Figure 25:
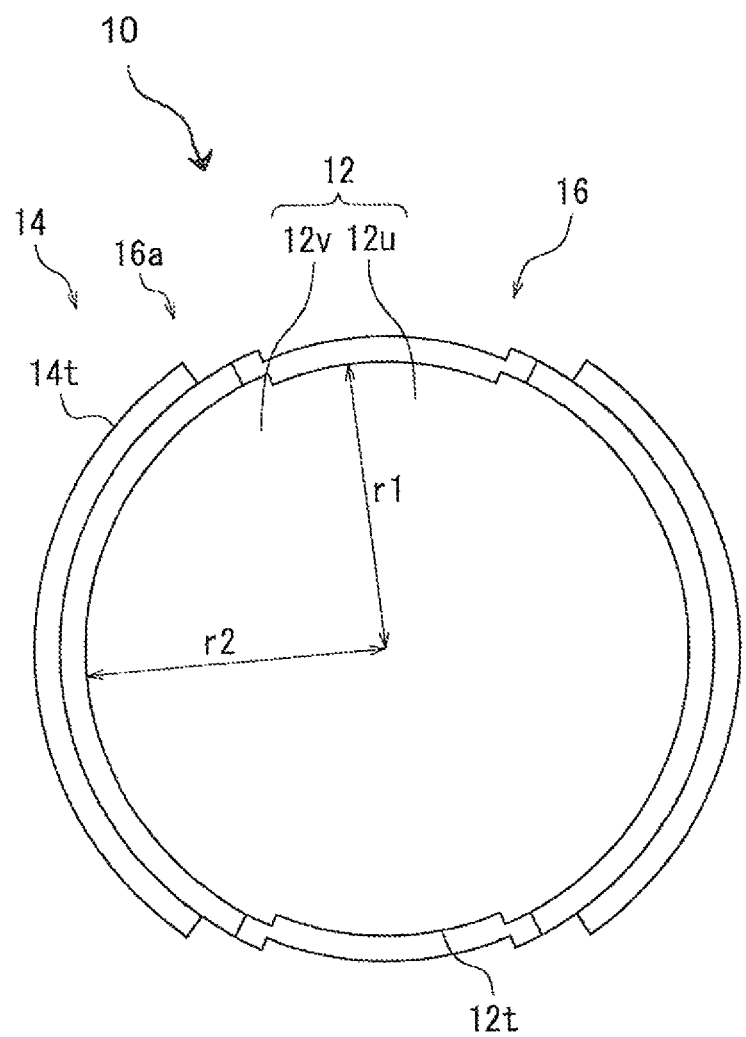
FIG. 25 is a schematic illustration of a transfer roll in a printer according to one embodiment.

FIG. 25 is a schematic illustration of a transfer roll 10. Here, the thickness of the blankets 14 and the thickness of the base 16 are almost constant, and steps are formed in the outer peripheral surface 12t of the core 12. Specifically, the core 12 includes regions 12u with a radius r1 and regions 12v with a radius r2 larger than the radius r1. Each blanket 14 is provided in the region 12v with the radius r2 larger than the radius r1 through the base 16 in FIG. 25. As such, formation of the steps in the core 12 can achieve appropriate printing on the to-be-printed object S even having a comparatively deep concave surface. It is noted that in view of replacement of the blankets 14, the central angle of the base portions 16a, on which the blankets 14 are provided, is preferably smaller than the central angle of the region 12v of the core 12.

It is noted that the steps are formed in the core 12 of the transfer roll 10 shown in FIG. 25, which however, should not be taken to limit the present invention. A step may be formed in each blanket 14.

Figure 26:
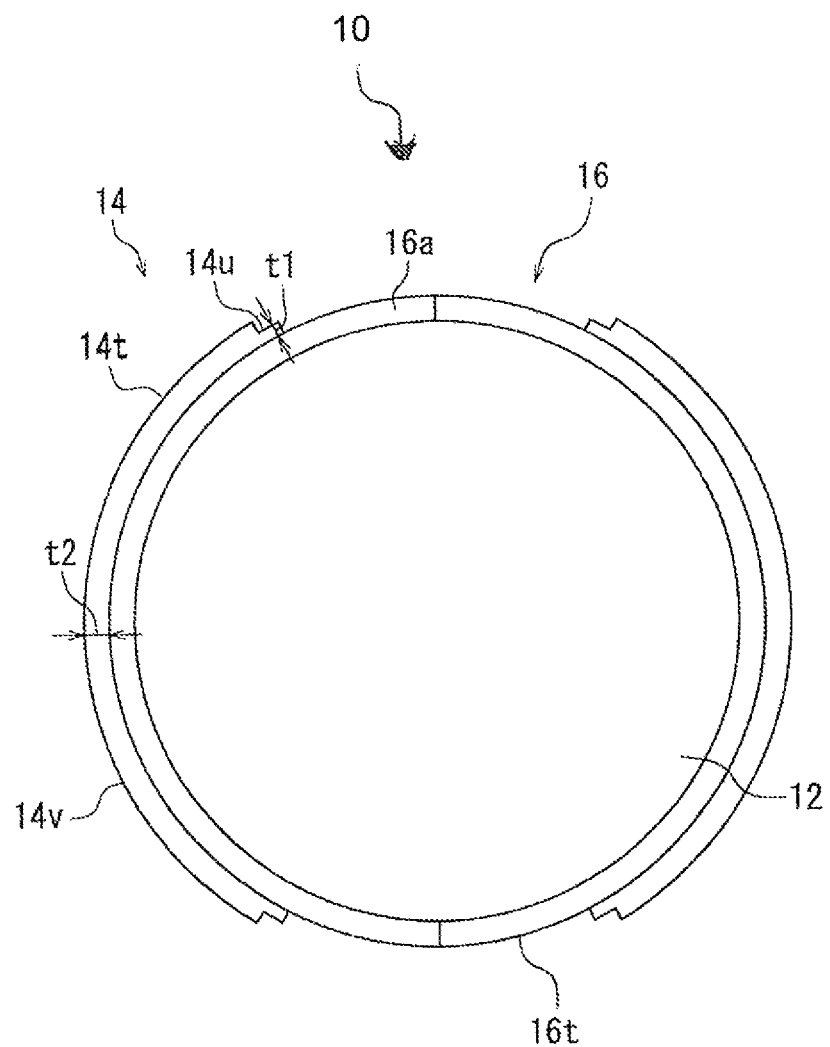
FIG. 26 is a schematic illustration of a transfer roll in a printer according to one embodiment.

FIG. 26 is a schematic illustration of a transfer roll 10. Here, the radius of the core 12 and the thickness of the base 16 are almost constant, and steps are formed in the outer surfaces 14t of the blankets 14. Specifically, each blanket 14 includes a region 14u with a thickness t1 and a region 14v with a thickness t2 larger than the thickness t1. Each thickness herein means a distance between the outer peripheral surface 16t of the base 16 and the outer surface 14t of the blanket 14 in a cross section perpendicular to the direction of the rotational axis. As such, formation of the steps in the blankets 14 can achieve appropriate printing on the to-be-printed object S even having a comparatively deep concave surface.

The present invention can provide a printer capable of forming a layered structure including a conductive layer even in small installation space. The printer according to the present invention can be suitably employed in fabrication of electronic equipment, such as solar cell panels, touch panels, electro-magnetic wave shield panels, solar cell modules, etc.

What is claimed is:

1. A printer, comprising:
    a transfer roll;
    a first printing roll arranged on the periphery of the transfer roll and having a groove in a first wiring pattern configured to transfer the first wiring pattern of a first ink containing a first conductive material in the groove to the transfer roll, the first wiring pattern including a linear part; and
    a second printing roll arranged on the periphery of the transfer roll and having a groove in a second wiring pattern configured to transfer the second wiring pattern of a second ink containing a second conductive material in the groove to the transfer roll, the second wiring pattern including a linear part,
    wherein the first wiring pattern of the first printing roll and the second wiring pattern of the second printing roll are formed such that the linear part of the second ink entirely covers the linear part of the first ink on the transfer roll such that the first and second wiring patterns are printed on a to-be-printed object by the transfer roll at the same time.

2. The printer of claim 1, wherein
the second conductive material is the same as the first conductive material.

3. The printer of claim 1, wherein
the second conductive material is different from the first conductive material.

4. The printer of claim 1, wherein
the transfer roll includes a core and a plurality of blankets supported by the core.

5. The printer of claim 4, wherein
the transfer roll further includes a base provided between the core and the plurality of blankets, and
the base includes a plurality of base portions.

6. The printer of claim 1, wherein the groove of at least one of the first printing roll and the second printing roll has a width of less than 3 mm.

7. The printer of claim 1, wherein the groove of at least one of the first printing roll and the second printing roll has a width of less than 70 μm.

8. A printing apparatus, comprising:
a conveyor configured to convey a to-be-printed object; and
a printer configured to perform printing on the to-be-printed object,
wherein the printer is the printer of claim 1.

9. A printing apparatus, comprising:
a conveyor configured to convey a to-be-printed object; and
a plurality of printers each configured to perform printing on the to-be-printed object,
wherein each of the plurality of printers is the printer of claim 1.

10. A printing method, comprising:
transferring, by a first printing roll with a groove in a first wiring pattern, the first wiring pattern of a first ink containing a first conductive material in the groove of the first printing roll to a transfer roll, the first wiring pattern including a linear part;
transferring, by a second printing roll with a groove in a second wiring pattern, the second wiring pattern of a second ink containing a second conductive material in the groove of the second printing roll to the transfer roll, the second wiring pattern including a linear part, wherein the transferring of the second wiring pattern of the second ink to the transfer roll by the second printing roll includes transferring the second ink to the transfer roll by the second printing roll so that the linear part of the second ink entirely covers the linear part of the first ink; and
printing the first ink transferred from the first printing roll and the second ink transferred from the second printing roll on a to-be-printed object by the transfer roll at the same time,
wherein the transferring the second wiring pattern of a second ink to the transfer roll by a second printing roll includes transferring the second ink to the transfer roll by the second printing roll so that the linear part of the second ink entirely covers the linear part of the first ink.

11. The printing method of claim 10, wherein the groove of at least one of the first printing roll and the second printing roll has a width of less than 3 mm.

12. The printing method of claim 10, wherein the groove of at least one of the first printing roll and the second printing roll has a width of less than 70 μm.

* * * * *